US009281069B2

(12) United States Patent
Jang et al.

(10) Patent No.: US 9,281,069 B2
(45) Date of Patent: Mar. 8, 2016

(54) METHOD OF PROGRAMMING A NONVOLATILE MEMORY DEVICE

(71) Applicants: Joon-Suc Jang, Hwaseong-si (KR); Dong-Hun Kwak, Hwaseong-si (KR)

(72) Inventors: Joon-Suc Jang, Hwaseong-si (KR); Dong-Hun Kwak, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/274,041

(22) Filed: May 9, 2014

(65) Prior Publication Data

US 2014/0247657 A1    Sep. 4, 2014

Related U.S. Application Data

(63) Continuation of application No. 13/305,183, filed on Nov. 28, 2011, now abandoned.

(30) Foreign Application Priority Data

Dec. 30, 2010 (KR) ........................ 10-2010-0138502

(51) Int. Cl.
| | |
|---|---|
| *G11C 16/10* | (2006.01) |
| *G11C 16/12* | (2006.01) |
| *G11C 11/56* | (2006.01) |
| *G11C 16/34* | (2006.01) |

(52) U.S. Cl.
CPC ............ *G11C 16/12* (2013.01); *G11C 11/5628* (2013.01); *G11C 16/10* (2013.01); *G11C 16/3418* (2013.01); *G11C 16/3459* (2013.01)

(58) Field of Classification Search
CPC .... G11C 16/12; G11C 16/10; G11C 16/3459; G11C 16/3418; G11C 11/5628

USPC ............ 365/185.02, 185.18, 185.22, 185.24, 365/185.03
See application file for complete search history.

(56) References Cited

U.S. PATENT DOCUMENTS

| | | | |
|---|---|---|---|
| 6,888,758 B1 * | 5/2005 | Hemink et al. | .......... 365/185.22 |
| 6,954,378 B2 | 10/2005 | Tanaka | |
| 7,173,859 B2 | 2/2007 | Hemink | |
| 7,394,691 B2 | 7/2008 | Shibata et al. | |
| 7,450,432 B2 | 11/2008 | Wang | |
| 7,474,560 B2 | 1/2009 | Aritome | |

(Continued)

FOREIGN PATENT DOCUMENTS

| | | |
|---|---|---|
| CN | 1905069 A | 1/2007 |
| CN | 101231888 A | 7/2008 |

(Continued)

*Primary Examiner* — Douglas King
(74) *Attorney, Agent, or Firm* — Harness, Dickey & Pierce, P.L.C.

(57) ABSTRACT

In method of programming a nonvolatile memory device including a plurality of multi-level cells that store multi-bit data according to example embodiments, a least significant bit (LSB) program operation is performed to program LSBs of the multi-bit data in the plurality of multi-level cells. A most significant bit (MSB) program operation is performed to program MSBs of the multi-bit data in the plurality of multi-level cells. To perform the MSB program, an MSB pre-program operation is performed on first multi-level cells, from among the plurality of multi-level cells, that are to be programmed to a highest target program state among a plurality of target program states, and an MSB main program operation is performed to program the plurality of multi-level cells to the plurality of target program states corresponding to the multi-bit data.

10 Claims, 15 Drawing Sheets

(56) References Cited

U.S. PATENT DOCUMENTS

| | | |
|---|---|---|
| 7,489,547 B2 | 2/2009 | Moogat et al. |
| 7,548,457 B2 * | 6/2009 | Kang ............... G11C 11/5628 365/185.03 |
| 7,606,070 B2 | 10/2009 | Mokhlesi |
| 7,643,340 B2 | 1/2010 | Kong et al. |
| 7,660,159 B2 | 2/2010 | Hwang et al. |
| 7,701,768 B2 | 4/2010 | Hwang |
| 7,701,775 B2 | 4/2010 | Kang |
| 7,764,542 B2 | 7/2010 | Edahiro et al. |
| 7,881,106 B2 | 2/2011 | Sukegawa |
| 8,331,145 B2 * | 12/2012 | Kang ............... G11C 11/5621 365/185.03 |
| 2005/0007801 A1 | 1/2005 | Barzilai et al. |
| 2007/0076487 A1 | 4/2007 | Takeuchi et al. |
| 2008/0259686 A1 | 10/2008 | Hwang |
| 2009/0129168 A1 * | 5/2009 | Kim et al. ............ 365/185.19 |
| 2009/0147573 A1 * | 6/2009 | Hemink ............... 365/185.03 |
| 2009/0285021 A1 | 11/2009 | Lim |
| 2009/0323429 A1 | 12/2009 | Lee et al. |
| 2010/0246260 A1 | 9/2010 | Kang |
| 2012/0163079 A1 | 6/2012 | Shalvi et al. |
| 2013/0176792 A1 | 7/2013 | Lee |

FOREIGN PATENT DOCUMENTS

| | | |
|---|---|---|
| JP | 11-242891 A | 9/1999 |
| JP | 2003-346487 A | 12/2003 |
| JP | 2005-322248 A | 11/2005 |
| JP | 2006-294126 A | 10/2006 |
| JP | 2008-535145 A | 8/2008 |
| JP | 2008-257781 A | 10/2008 |
| JP | 2010-515203 A | 5/2010 |
| KR | 10-0861378 B1 | 9/2008 |

* cited by examiner

|  | LSB PROGRAM | MSB PROGRAM |
|---|---|---|
| ⋮ | ⋮ | ⋮ |
| WL3 | ④ | ⑥ |
| WL2 | ② | ⑤ |
| WL1 | ① | ③ |

METHOD OF PROGRAMMING A NONVOLATILE MEMORY DEVICE

CROSS-REFERENCE TO RELATED APPLICATIONS

This U.S. non-provisional application is a Continuation of U.S. application Ser. No. 13/305,183, filed on Nov. 28, 2011, and claims priority under 35 U.S.C. §119 to Korean Patent Application No. 2010-0138502 filed on Dec. 30, 2010 in the Korean Intellectual Property Office (KIPO), the entire contents of each of which are incorporated herein by reference.

BACKGROUND

1. Technical Field

Example embodiments relate to nonvolatile memory devices. More particularly, example embodiments relate to methods of programming nonvolatile memory devices including multi-level cells.

2. Description of the Related Art

Memory cells of a nonvolatile memory device, such as a flash memory device, may be classified into single level cells (SLCs) that store one bit of data per memory cell and multi-level cells (MLCs) that store more than one bit of data per memory cell. The MLCs may store multiple bits of data by using multiple threshold voltage distributions to represent different states of multi-bit data. For example, two-bit MLCs may use four threshold voltage distributions to represent respective logical states "11", "10", "01" and "00".

To ensure accurate storage of the multi-bit data, the threshold voltage distributions of the MLCs must be separated by adequate sensing margins. However, certain aspects of newer flash memory devices, such as increasing integration density, may cause the threshold voltage distributions to widen due to electrical coupling between adjacent memory cells or a program disturb.

SUMMARY

Some example embodiments provide a method of programming a nonvolatile memory device capable of narrowing threshold voltage distributions.

According to example embodiments, in a method of programming a nonvolatile memory device including multi-level cells that store multi-bit data, a least significant bit (LSB) program operation is performed to program LSBs of the multi-bit data in the multi-level cells, and a most significant bit (MSB) program operation is performed to program MSBs of the multi-bit data in the multi-level cells. To perform the MSB program operation, an MSB pre-program operation is performed on first multi-level cells that are to be programmed to a highest target program state among a plurality of target program states, and an MSB main program operation is performed to program the multi-level cells to the plurality of target program states corresponding to the multi-bit data.

In some embodiments, to perform the MSB pre-program operation, the first multi-level cells may be programmed to an intermediate program state corresponding to the highest target program state by applying a one-shot pulse to the first multi-level cells.

In some embodiments, to perform the MSB pre-program operation, an incremental step pulse may be applied to the first multi-level cells, and a pre-program verify voltage may be applied to the first multi-level cells to verify whether the first multi-level cells are programmed to an intermediate program state corresponding to the highest target program state.

In some embodiments, to perform the MSB pre-program operation, the first multi-level cells may be programmed to a first intermediate program state corresponding to the highest target program state, the first intermediate program state may be divided into a plurality of sections, and the first multi-level cells may be programmed to a second intermediate program state narrower than the first intermediate program state by, for each of the first multi-level cells, increasing a threshold voltage of the first multi-level cell by one of a plurality of different voltage amounts based on which of the plurality of sections the first multi-level cell corresponds to.

In some embodiments, to program the first multi-level cells to the first intermediate program state, a first one-shot pulse may be applied to the first multi-level cells.

In some embodiments, to divide the first intermediate program state into the plurality of sections, at least one division voltage may be applied to the first multi-level cells to determine which of the plurality of sections each first multi-level cell exists in.

In some embodiments, the plurality of sections may include a first section, a second section and a third section. To program the first multi-level cells to the second intermediate program state, a first voltage of low level may be applied to bitlines coupled to the first multi-level cells in the first section, a forcing voltage may be applied to bitlines coupled to the first multi-level cells in the second section, a second voltage of high level may be applied to bitlines coupled to the first multi-level cells in the third section, and a second one-shot pulse may be applied to a selected wordline coupled to the first multi-level cells.

In some embodiments, the first voltage may be a low power supply voltage, the second voltage may be a high power supply voltage, and the forcing voltage may have a voltage level higher than that of the first voltage and lower than that of the second voltage.

In some embodiments, the second one-shot pulse is applied to the selected wordline such that threshold voltages of the first multi-level cells in the third section may not be substantially increased, and increments of threshold voltages of the first multi-level cells in the second section may be smaller than increments of threshold voltages of the first multi-level cells in the first section.

According to example embodiments, in a method of programming a nonvolatile memory device including multi-level cells that store multi-bit data, a least significant bit (LSB) program operation is performed to program LSBs of the multi-bit data in the multi-level cells, and a most significant bit (MSB) program operation is performed to program MSBs of the multi-bit data in the multi-level cells. To perform the MSB program operation, an MSB pre-program is performed on first multi-level cells that are to be programmed to at least one target program state among a plurality of target program states, and an MSB main program operation is performed to program the multi-level cells to the plurality of target program states corresponding to the multi-bit data.

In some embodiments, the at least one target program state may include a highest target program state among the plurality of target program states.

In some embodiments, the at least one target program state may include all the plurality of target program states.

In some embodiments, to perform the MSB pre-program operation, the multi-level cells may be programmed to a plurality of intermediate program states corresponding to the plurality of target program states by sequentially applying a plurality of one-shot pulses respectively corresponding to the plurality of intermediate program states to the multi-level cells.

In some embodiments, to perform the MSB pre-program operation, an incremental step pulse may be applied to the multi-level cells, and a plurality of pre-program verify voltages may be sequentially applied to the multi-level cells to verify whether the multi-level cells are programmed to a plurality of intermediate program states respectively corresponding to the plurality of target program states.

In some embodiments, to perform the MSB pre-program operation, the multi-level cells may be programmed to a first plurality of intermediate program states respectively corresponding to the plurality of target program states, each of the first plurality of intermediate program states may be divided into a plurality of sections, and the multi-level cells may be programmed to a second plurality of intermediate program states respectively narrower than the first plurality of intermediate program states by increasing threshold voltages of the multi-level cells by different voltage levels according to the plurality of sections.

According to at least one example embodiment, a method of programming multi-bit data in a plurality of multi-level cells of a nonvolatile memory device may include programming least significant bits (LSBs) of the multi-bit data in the multi-level cells; and programming most significant bits (MSBs) of the multi-bit data in the plurality of multi-level cells, for each of the plurality of multi-level cells, by verifying a threshold voltage of the multi-level cell using a verification voltage of a target voltage level, from among a plurality of target voltage levels, corresponding to the multi-level cell. Programming the MSBs may include performing a MSB pre-program operation, for each of first multi-level cells from among the plurality of multi-level cells, by verifying a threshold voltage of the first multi-level cell using a verification voltage of an intermediate voltage level corresponding to the first multi-level cell, the corresponding intermediate voltage level being lower than the corresponding target voltage level. After performing the MSB pre-program operation, an MSB main program operation may be performed, for each of the plurality of multi-level cells, by verifying a threshold voltage of the multi-level cell using the verification voltage of the target voltage level that corresponds to the multi-level cell.

A method of programming multi-bit data in a plurality of multi-level cells of a nonvolatile memory device may include programming least significant bits (LSBs) of the multi-bit data in the multi-level cells; and performing a most significant bit (MSB) pre-program operation by, for each of first multi-level cells from among the plurality of multi-level cells applying a first programming pulse to the first multi-level cell, determining a threshold voltage region, from among a plurality of threshold voltage regions, to which the first multi-level cell belongs, and applying, to the first multi-level cell, a second programming pulse having a voltage level selected from among a plurality of different voltage levels based on the region from among the plurality of regions to which the first multi-level cell corresponds. After performing the MSB pre-program operation, MSBs of the multi-bit data may be programmed in the multi-level cells.

As described above, the method of programming the nonvolatile memory device according to example embodiments may reduce the increase in width of each threshold voltage distribution, and may narrow the threshold voltage distributions.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF THE EMBODIMENTS

Figure 1:
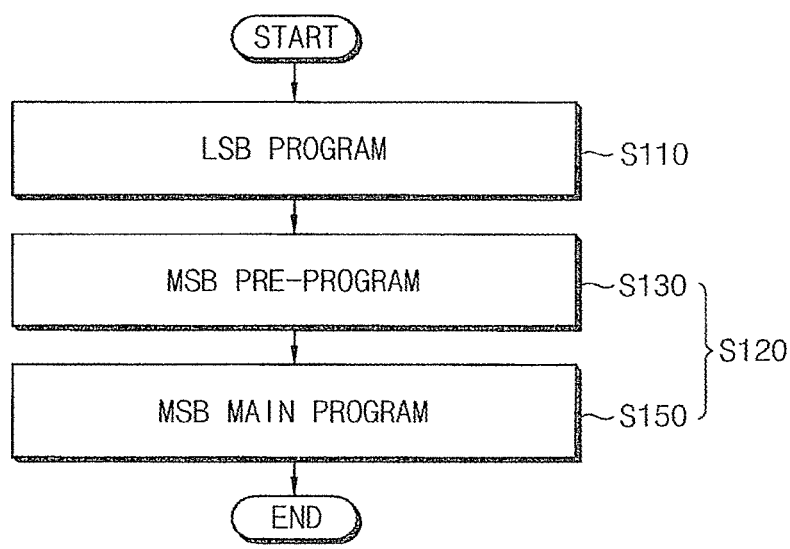
FIG. 1 is a flow chart illustrating a method of programming a nonvolatile memory device according to example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a flow chart illustrating a method of programming a nonvolatile memory device according to example embodiments.

Referring to FIG. 1, in a nonvolatile memory device including multi-level cells that store multi-bit data, a least significant bit (LSB) program is performed to program LSBs of the multi-bit data in the multi-level cells (S110). Here, the multi-bit data indicate data of which each has more than one bit, and the multi-level cells indicate nonvolatile memory cells storing more than one bit of data per memory cell.

For example, to perform the LSB program, a first voltage of low level (e.g., a low power supply voltage or a ground voltage) or a second voltage of high level (e.g., a high power supply voltage) may be selectively applied to respective bitlines coupled to the multi-level cells according to the LSBs of the multi-bit data, and a program voltage may be applied to a selected wordline coupled to the multi-level cells.

In some embodiments, the LSB program may be performed using an incremental step pulse program (ISPP) method. For example, to perform the LSB program, an incremental step pulse, which increases by a predetermined voltage level per program loop, may be applied to the multi-level cells, and verify voltages corresponding to the LSBs of the multi-bit data may be applied to verify whether the LSBs of the multi-bit data are properly programmed in the multi-level cells. In some embodiments, a pre-program operation may be further performed before the ISPP operation. The pre-program operation may be referred to as an LSB pre-program, and the ISPP operation may be referred to as an LSB main program.

After the LSB program, a most significant bit (MSB) program is performed to program MSBs of the multi-bit data in the multi-level cells (S120). The MSB program may include an MSB pre-program and an MSB main program.

The MSB pre-program may be performed such that the multi-level cells that are to be programmed to at least one target program state may be programmed to at least one intermediate program state lower than the at least one target program state (S130). In some embodiments, the MSB pre-program may be performed on the multi-level cells that are to be programmed to the highest target program state among a plurality of target program states corresponding to the multi-bit data. In other embodiments, the MSB pre-program may be performed on all the multi-level cells that are to be programmed to the plurality of target program states. In still other embodiments, the MSB pre-program may be performed on the multi-level cells that are to be programmed to one or more target program states corresponding to one or more values of the multi-bit data.

The MSB main program may be performed such that the multi-level cells are programmed to the target program states corresponding to the multi-bit data (S150). In some embodiments, the MSB main program may be performed using an ISPP method. For example, to perform the MSB main program, an incremental step pulse, which increases by a predetermined voltage level per program loop, may be applied to the multi-level cells, and verify voltages corresponding to the multi-bit data may be applied to verify whether the multi-level cells are properly programmed to the target program states corresponding to the multi-bit data.

As described above, in a method of programming a nonvolatile memory device according to some example embodiments, the MSB main program is performed after the MSB pre-program that programs the multi-level cells to at least one intermediate program state, thereby reducing the increase in width of threshold voltage distributions due to coupling or a disturb. In particular, the undesired increase of a threshold voltage distribution of an erase state may be reduced. Accordingly, the threshold voltage distributions of the multi-level cells may be narrowed.

Figure 2:
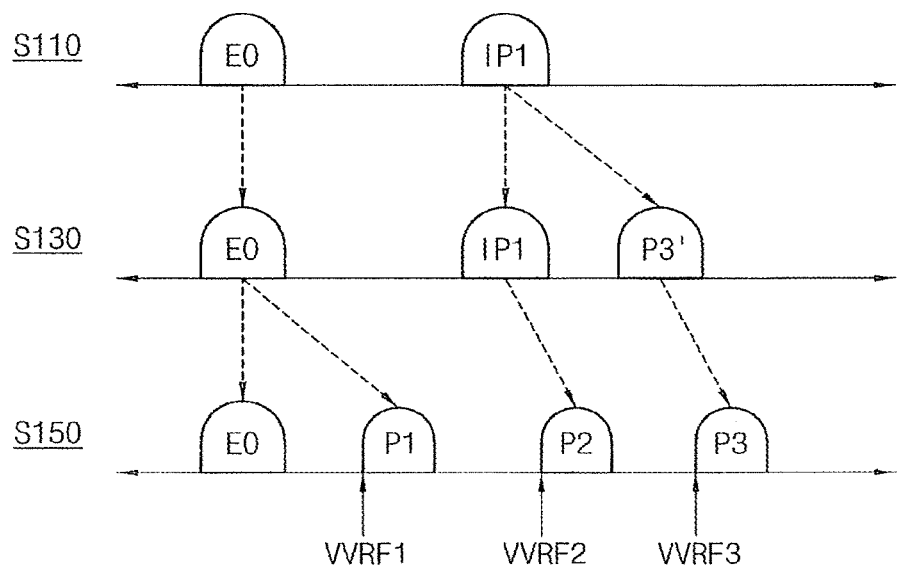
FIG. 2 is a diagram illustrating an example of threshold voltage distributions of multi-levels cells programmed by a program method according to example embodiments.

FIG. 2 is a diagram illustrating an example of threshold voltage distributions of multi-levels cells programmed by a program method according to example embodiments.

Referring to FIGS. 1 and 2, an LSB program may be performed such that each multi-level cell may have an erase state E0 or a first intermediate state IP1 according to an LSB of corresponding multi-bit data (S110). For example, if multi-bit data to be programmed in a multi-level cell has an LSB of "1", the multi-level cell may be programmed to the erase state E0 by the LSB program. If multi-bit data to be programmed in a multi-level cell has an LSB of "0", the multi-level cell may be programmed to the first intermediate state IP1 by the LSB program.

An MSB pre-program may be performed such that multi-level cells that are to be programmed to the highest target program state P3 may be programmed to an intermediate program state P3' corresponding to the highest target program state P3 (S130). For example, among the multi-level cells having the first intermediate state IP1, threshold voltages of the multi-level cells to be programmed to a second target program state P2 may not be increased by the MSB pre-program, and threshold voltages of the multi-level cells to be programmed to a third target program state P3 (i.e., the highest target program state) may be increased by the MSB pre-program.

An MSB main program may be performed such that each multi-level cell may have one of the erase state E0, a first target program state P1, the second target program state P2 and the target third program state P3 according to corresponding multi-bit data (S150). For example, by the MSB main program, a portion of the multi-level cells having the erase state E0 may be programmed to the first target program state P1 using a first verify voltage VVRF1 according to the multi-bit data, the multi-level cells having the first intermediate state IP1 may be programmed to the second target program state P2 using a second verify voltage VVRF2, and the multi-level cells having the intermediate program state P3' corresponding to the third target program state P3 may be programmed to the third target program state P3 using a third verify voltage VVRF3.

For example, the erase state E0, the first target program state P1, the second target program state P2 and the third target program state P3 may correspond to values of the multi-bit data "11", "01", "00" and "10", respectively. According to example embodiments, various logic vales of the multi-bit data may be allocated to the respective target states E0, P1, P2 and P3.

An undesired threshold voltage shift of a multi-level cell having the erase state E0 may be caused mainly by a program disturb and coupling. While multi-level cells coupled to the same wordline as the multi-level cell having the erase state E0 are programmed to the first and second target program states P1 and P2, the program disturb may occur. In a case where multi-level cells adjacent to the multi-level cell having the erase state E0 are programmed to the highest target program state P3, the coupling may occur. An amount of the threshold voltage shift caused by the program disturb may change depending on a threshold voltage level of the multi-level cell having the erase state E0. For example, in a case where a threshold voltage of a multi-level cell is relatively high, the threshold voltage of the multi-level cell may be less affected by the program disturb than a multi-level cell having a relatively low threshold voltage. However, an amount of the threshold voltage shift caused by the coupling may change less, or not at all, even if the threshold voltage level of the multi-level cell having the erase state E0 changes. In the program method according to example embodiments, the MSB pre-program is performed on the multi-level cells that are to be programmed to the highest target program state P3. Thus, the multi-level cell having the erase state E0 may be first affected by the coupling, and then may be later affected by the program disturb. Accordingly, since the multi-level cell is affected by the program disturb after the threshold voltage of the multi-level cell is increased by the coupling, the overall threshold voltage shift of the multi-level cell may be reduced.

Further, in the program method according to example embodiments, since the multi-level cells to be programmed to the highest target program state P3 have threshold voltages substantially close to the third verify voltage VVRF3 corresponding to the highest target program state P3 by the MSB pre-program, the multi-level cells may be programmed to the highest target program state P3 by initial program pulses having relatively low voltage levels during the MSB main program. Accordingly, the MSB main program may be rapidly completed, and a width of each target state E0, P1, P2 and P3 may be reduced.

Figure 3:
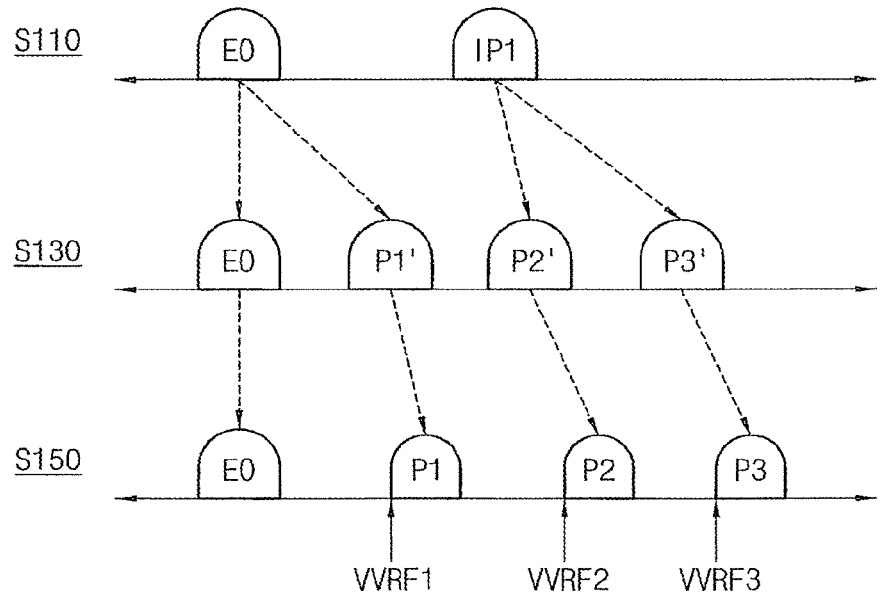
FIG. 3 is a diagram illustrating another example of threshold voltage distributions of multi-levels cells programmed by a program method according to example embodiments.

FIG. 3 is a diagram illustrating another example of threshold voltage distributions of multi-levels cells programmed by a program method according to example embodiments.

Referring to FIGS. 1 and 3, an LSB program may be performed such that each multi-level cell may have an erase state E0 or a first intermediate state IP1 according to an LSB of corresponding multi-bit data (S110).

An MSB pre-program may be performed such that multi level cells that are to be programmed to first through third target program states P1, P2 and P3 may be programmed to intermediate program states P1', P2' and P3' corresponding to the first through third target program states P1, P2 and P3, respectively (S130). For example, by the MSB pre-program, multi-level cells to be programmed to the first target program state P1 may be programmed to the intermediate program state P1' corresponding to the first target program state P1, multi-level cells to be programmed to the second target program state P2 may be programmed to the intermediate program state P2' corresponding to the second target program state P2, and multi-level cells to be programmed to the third target program state P3 may be programmed to the intermediate program state P3' corresponding to the third target program state P3.

An MSB main program may be performed such that each multi-level cell may have one of the erase state E0, the first target program state P1, the second target program state P2 and the third target program state P3 according to corresponding multi-bit data (S150). For example, by the MSB main program, the multi-level cells having the intermediate program state P1' corresponding to the first target program state P1 may be programmed to the first target program state P1, the multi-level cells having the intermediate program state P2' corresponding to the second target program state P2 may be programmed to the second target program state P2, and the multi-level cells having the intermediate program state P3' corresponding to the third target program state P3 may be programmed to the third target program state P3.

If adjacent memory cells are programmed after the memory cell is programmed, a threshold voltage of the memory cell may be undesirably increased by coupling with the adjacent memory cells. In the program method according to example embodiments, since the multi-level cells to be programmed to the target program states P1, P2 and P3 have threshold voltages substantially close to verify voltages VVRF1, VVRF2 and VVRF3 respectively corresponding to the target program states P1, P2 and P3 by the MSB pre-program, increments of the threshold voltages of the multi-level cells during the MSB main program may be substantially small. Accordingly, the undesired threshold voltage shift caused by the coupling may be reduced, and the target states E0, P1, P2 and P3 may have narrow widths.

For example, in a case where a second memory cell (which may be referred to as an aggressor cell) adjacent to a first memory cell (which may be referred to as a victim cell) is to be programmed to the third target program state P3, the second memory cell may have a threshold voltage close to a third verify voltage VVRF3 by the MSB pre-program, and an increment of the threshold voltage of the second memory cell during the MSB main program may be substantially small. Accordingly, during the MSB main program, even if the first memory cell is programmed before the second memory cell is programmed, the undesired threshold voltage shift caused by the coupling with the second memory cell may be reduced since an increment of the threshold voltage of the second memory cell is small.

Figure 4:
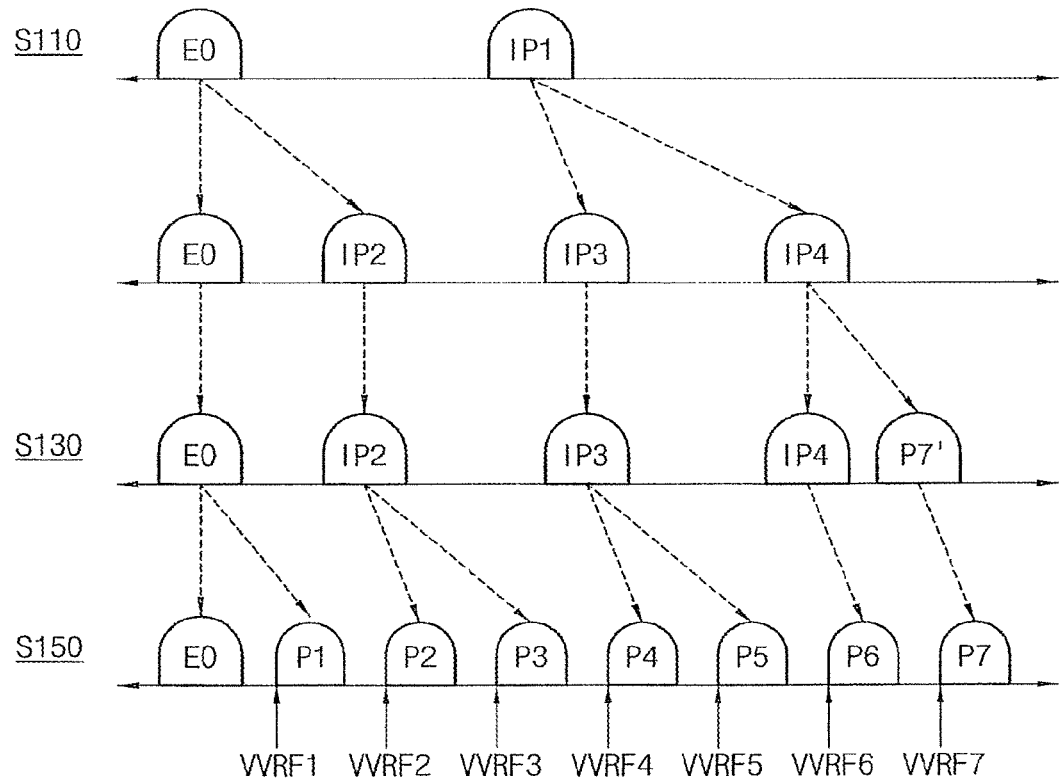
FIG. 4 is a diagram illustrating still another example of threshold voltage distributions of multi-levels cells programmed by a program method according to example embodiments.

FIG. 4 is a diagram illustrating still another example of threshold voltage distributions of multi-levels cells programmed by a program method according to example embodiments.

Referring to FIGS. 1 and 4, an LSB program may be performed such that each multi-level cell may have an erase state E0 or a first intermediate state IP1 according to an LSB of corresponding multi-bit data (S110).

An intermediate significant bit (ISB) program (which may also be referred to as a center significant bit (CSB) program) may be performed such that each multi-level cell may have one of the erase state E0, a second intermediate state IP2, a third intermediate state IP3 and a fourth intermediate state IP4 according to an ISB and the LSB of corresponding multi-bit data. For example, the erase state E0, the second intermediate state IP2, the third intermediate state IP3 and the fourth intermediate state IP4 may correspond to the ISB and the LSB "11", "01", "00" and "10", respectively, but not limited thereto. According to example embodiments, various logic vales of the ISB and the LSB may be allocated to the respective states E0, IP2, IP3 and IP4.

In some embodiments, the ISB program may be performed using an ISPP method. For example, to perform the ISB program, an incremental step pulse, which increases by a predetermined voltage level per program loop, may be applied to the multi-level cells, and verify voltages may be applied to verify whether the multi-level cells are properly programmed to the second through fourth intermediate states IP2, IP3 and IP4.

An MSB pre-program may be performed such that the multi level cells that are to be programmed to the highest target program state P7 may be programmed to an intermediate program state P7' corresponding to the highest target program state P7 (S130). For example, among the multi-level cells having the fourth intermediate state IP4, threshold voltages of the multi-level cells to be programmed to a sixth target program state P6 may not be increased by the MSB pre-program, and threshold voltages of the multi-level cells to be programmed to a seventh target program state P7 (i.e., the highest target program state) may be increased by the MSB pre-program.

An MSB main program may be performed such that each multi-level cell may have one of the erase state E0, a first target program state P1, a second target program state P2, a third target program state P3, a fourth target program state P4, a fifth target program state P5, the sixth target program state P6 and the seventh target program state P7 according to corresponding multi-bit data (S150). For example, by the MSB main program, a portion of the multi-level cells having the erase state E0 may be programmed to the first target program state P1 using a first verify voltage VVRF1 according to the multi-bit data, the multi-level cells having the second intermediate state IP2 may be programmed to the second target program state P2 using a second verify voltage VVRF2 or the third target program state P3 using a third verify voltage VVRF3, the multi-level cells having the third intermediate state IP3 may be programmed to the second target program state P4 using a fourth verify voltage VVRF4 or the fifth target program state P5 using a fifth verify voltage VVRF5, the multi-level cells having the fourth intermediate state IP4 may be programmed to the sixth target program state P6 using a sixth verify voltage VVRF6, and the multi-level cells having the intermediate program state P7' corresponding to the seventh target program state P7 may be programmed to the seventh target program state P7 using a seventh verify voltage VVRF7.

For example, the erase state E0, the first target program state P1, the second target program state P2, the third target program state P3, the fourth target program state P4, the fifth target program state P5, the sixth target program state P6 and the seventh target program state P7 may correspond to the multi-bit data "111", "011", "001", "101", "100", "000", "010" and "110", respectively, but not limited thereto. According to example embodiments, various logic vales of the multi-bit data may be allocated to the respective target states E0, P1, P2, P3, P4, P5, P6 and P7.

In the program method according to example embodiments, since the MSB pre-program is performed on the multi-level cells to be programmed to the highest target program state P7, an overall threshold voltage shift of a multi-level cell having the erase state E0 may be reduced, and a width of each target state E0, P1, P2, P3, P4, P5, P6 and P7 may be reduced.

Figure 5:
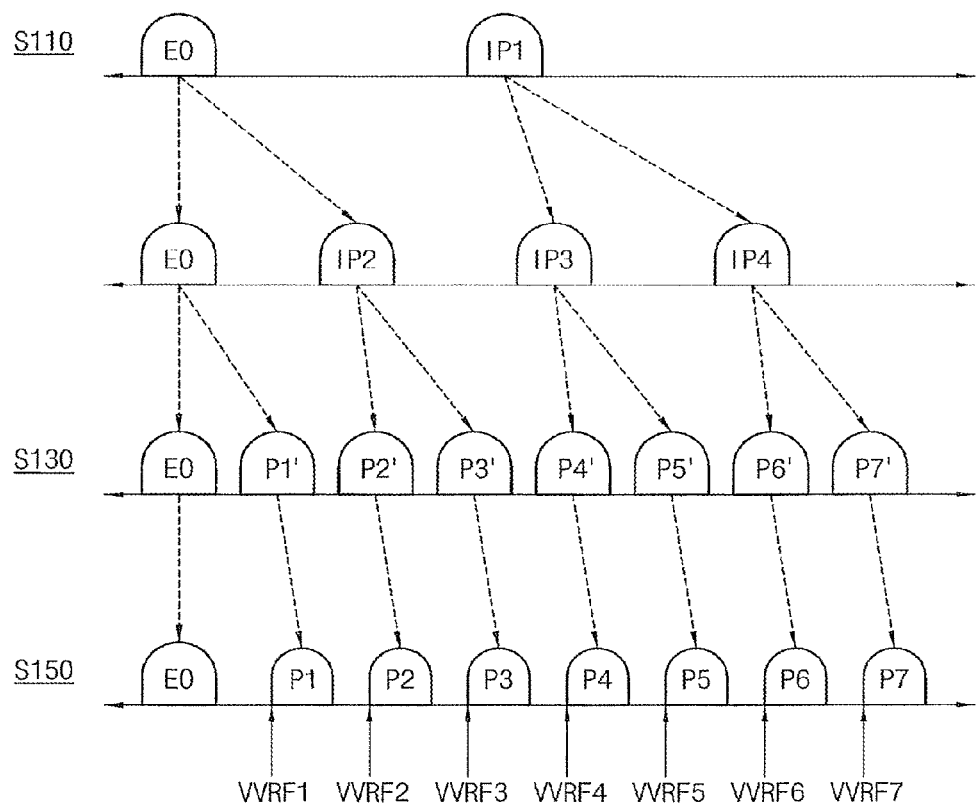
FIG. 5 is a diagram illustrating still another example of threshold voltage distributions of multi-levels cells programmed by a program method according to example embodiments.

FIG. 5 is a diagram illustrating still another example of threshold voltage distributions of multi-levels cells programmed by a program method according to example embodiments.

Referring to FIGS. 1 and 5, an LSB program may be performed such that each multi-level cell may have an erase state E0 or a first intermediate state IP1 according to an LSB of corresponding multi-bit data (S110).

An ISB program may be performed such that each multi-level cell may have one of the erase state E0, a second intermediate state IP2, a third intermediate state IP3 and a fourth intermediate state IP4 according to an ISB and the LSB of corresponding multi-bit data.

An MSB pre-program may be performed such that multi level cells that are to be programmed to target program states P1, P2, P3, P4, P5, P6 and P7 may be programmed to intermediate program states P1', P2', P3', P4', P5', P6' and P7' corresponding to the target program states P1, P2, P3, P4, P5, P6 and P7 (S130). For example, by the MSB pre-program, multi-level cells to be programmed to a first target program state P1 may be programmed to an intermediate program state P1' corresponding to the first target program state P1, multi-level cells to be programmed to a second target program state P2 may be programmed to an intermediate program state P2' corresponding to the second target program state P2, multi-level cells to be programmed to a third target program state P3 may be programmed to an intermediate program state P3' corresponding to the third target program state P3, multi-level cells to be programmed to a fourth target program state P4 may be programmed to an intermediate program state P4' corresponding to the fourth target program state P4, multi-level cells to be programmed to a fifth target program state P5 may be programmed to an intermediate program state P5' corresponding to the fifth target program state P5, multi-level cells to be programmed to a sixth target program state P6 may be programmed to an intermediate program state P6' corresponding to the sixth target program state P6, and multi-level cells to be programmed to a seventh target program state P7 may be programmed to an intermediate program state P7' corresponding to the seventh target program state P7.

An MSB main program may be performed such that each multi-level cell may have one of the erase state E0, the first target program state P1, the second target program state P2, the third target program state P3, the fourth target program state P4, the fifth target program state P5, the sixth target program state P6 and the seventh target program state P7 according to corresponding multi-bit data (S150).

In the program method according to example embodiments, since the MSB pre-program is performed on the multi-level cells to be programmed to the target program states P1, P2, P3, P4, P5, P6 and P7, the undesired threshold voltage shift caused by the coupling may be reduced, and the target states E0, P1, P2, P3, P4, P5, P6 and P7 may have narrow widths.

Although it is not illustrated in FIGS. 4 and 5, in some embodiments, the ISB program may include a pre-program and a main program.

Figure 6:
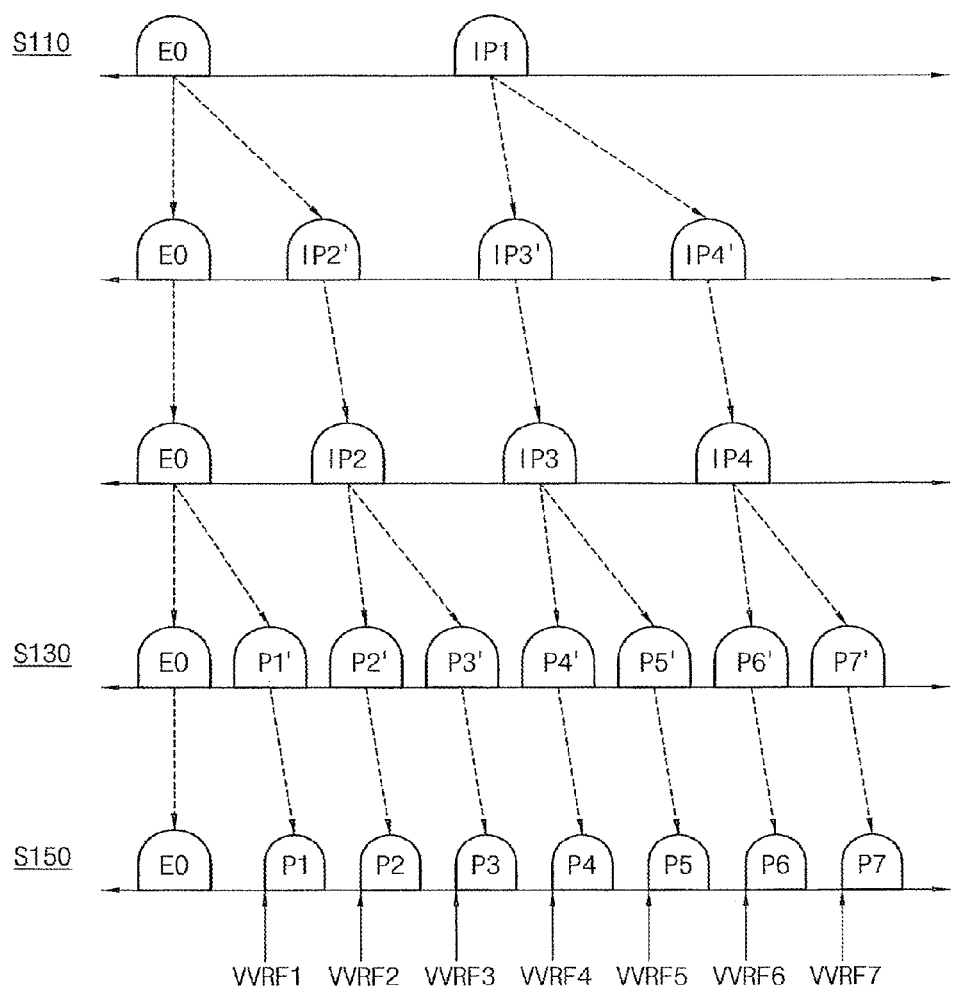
FIG. 6 is a diagram illustrating still another example of threshold voltage distributions of multi-levels cells programmed by a program method according to example embodiments.

FIG. 6 is a diagram illustrating still another example of threshold voltage distributions of multi-levels cells programmed by a program method according to example embodiments.

Referring to FIGS. 1 and 6, an LSB program may be performed such that each multi-level cell may have an erase state E0 or a first intermediate state IP1 according to an LSB of corresponding multi-bit data (S110).

An ISB program may be performed such that each multi-level cell may have one of the erase state E0, a second intermediate state IP2, a third intermediate state IP3 and a fourth intermediate state IP4 according to an ISB and the LSB of corresponding multi-bit data. In some embodiments, the ISB program may include an ISB pre-program and an ISB main program. By the ISB pre-program, the multi-level cells may be programmed to intermediate states IP2', IP3' and IP4' respectively corresponding to the second through fourth intermediate states IP2, IP3 and IP4. By the ISB main program, the multi-level cells programmed to the intermediate states IP2', IP3' and IP4' may be further programmed to the second through fourth intermediate states IP2, IP3 and IP4, respectively.

Although FIG. 6 illustrates an example where the ISB pre-program is performed on the multi-level cells to be programmed to the second through fourth intermediate states IP2, IP3 and IP4, the ISB pre-program may be performed on multi-level cells to be programmed to one or more intermediate states IP2, IP3 and IP4.

An MSB pre-program may be performed such that multi level cells to be programmed to target program states P1, P2, P3, P4, P5, P6 and P7 may be programmed to intermediate program states P1', P2', P3', P4', P5', P6' and P7' corresponding to the target program states P1, P2, P3, P4, P5, P6 and P7 (S130).

An MSB main program may be performed such that each multi-level cell may have one of the erase state E0, the first target program state P1, the second target program state P2, the third target program state P3, the fourth target program state P4, the fifth target program state P5, the sixth target program state P6 and the seventh target program state P7 according to corresponding multi-bit data (S150).

Although FIGS. 2 and 3 illustrate examples where the multi-level cells store two bits of data per memory cell, and FIGS. 4 through 6 illustrate examples where the multi-level cells store three bits of data per memory cell, the program method according to example embodiments may be also applied to multi-level cells storing four or more bits of data.

Figure 7:
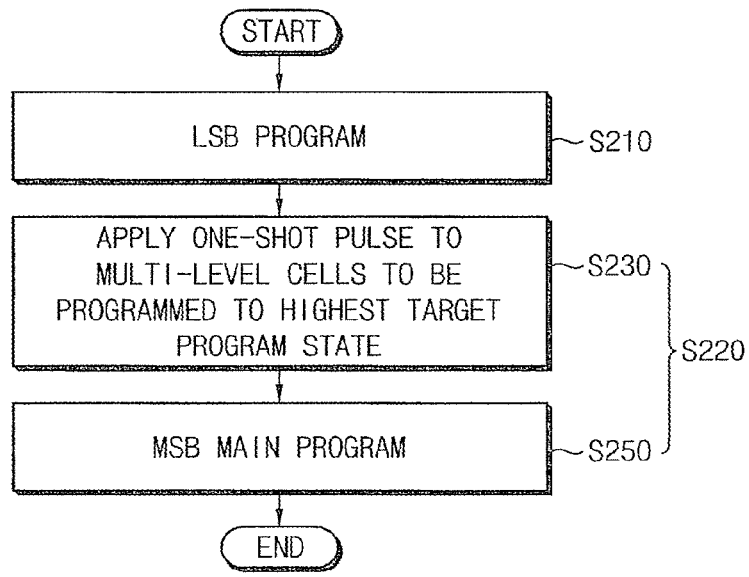
FIG. 7 is a flow chart illustrating a method of programming a nonvolatile memory device according to example embodiments.
Figure 8:
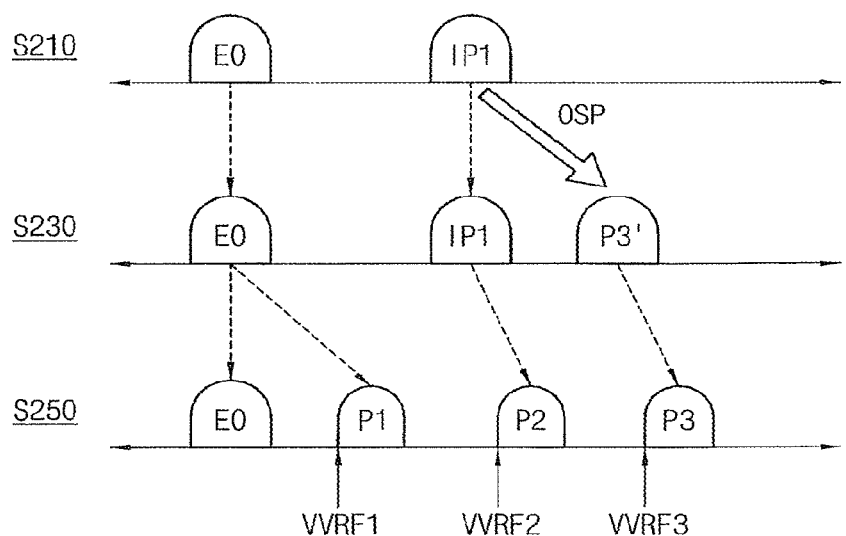
FIG. 8 is a diagram illustrating an example of threshold voltage distributions of multi-levels cells programmed by a program method of FIG. 7.

FIG. 7 is a flow chart illustrating a method of programming a nonvolatile memory device according to example embodiments, and FIG. 8 is a diagram illustrating an example of threshold voltage distributions of multi-levels cells programmed by a program method of FIG. 7.

Referring to FIGS. 7 and 8, an LSB program may be performed such that each multi-level cell may have an erase state E0 or an intermediate state IP1 according to an LSB of corresponding multi-bit data (S210).

After the LSB program, an MSB program may be performed to program MSBs of the multi-bit data in the multi-level cells (S220). The MSB program may include an MSB pre-program and an MSB main program.

The MSB pre-program may be performed by applying a one-shot pulse OSP to the multi-level cells that are to be programmed to the highest target program state P3 (S230). Here, the one-shot pulse OSP may represent a pulse applied once. For example, to perform the MSB pre-program, a first voltage of low level (e.g., a low power supply voltage or a ground voltage) may be applied to bitlines coupled to the multi-level cells to be programmed to the highest target program state P3, a second voltage of high level (e.g., a high power supply voltage) may be applied to bitlines coupled to the other multi-level cells, and the one-shot pulse OSP may be applied to a selected wordline coupled to the multi-level cells. After the MSB pre-program, the multi-level cells to be programmed to the highest target program state P3 may have an intermediate program state P3' corresponding to the highest target program state P3.

An MSB main program may be performed such that each multi-level cell has one of the erase state E0, a first target program state P1, a second target program state P2 and the third target program state P3 according to the multi-bit data (S250).

As described above, in a method of programming a nonvolatile memory device according to example embodiments, since the MSB pre-program is performed on the multi-level cells to be programmed to the highest target program state P3, an undesired threshold voltage shift of a multi-level cell having the erase state E0 due to coupling or a disturb may be reduced, and widths of the target states E0, P1, P2 and P3 may be reduced.

Figure 9:
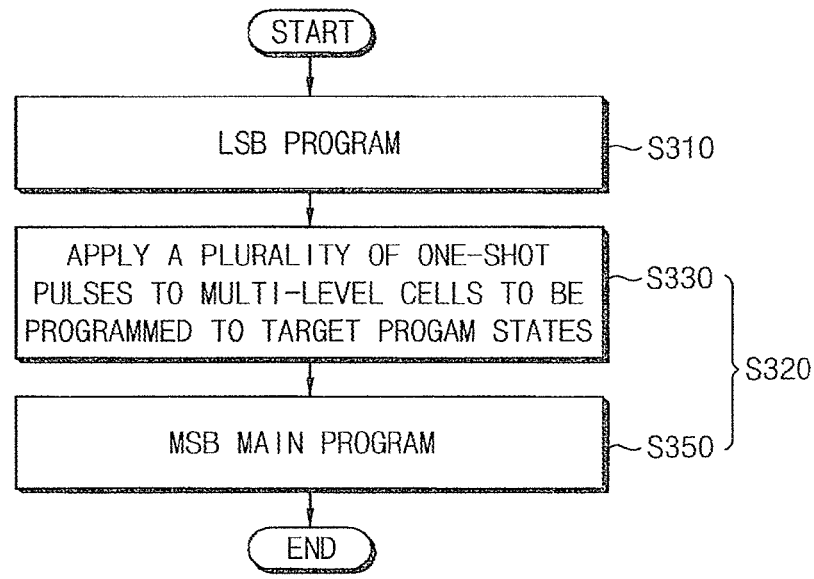
FIG. 9 is a flow chart illustrating a method of programming a nonvolatile memory device according to example embodiments.
Figure 10:
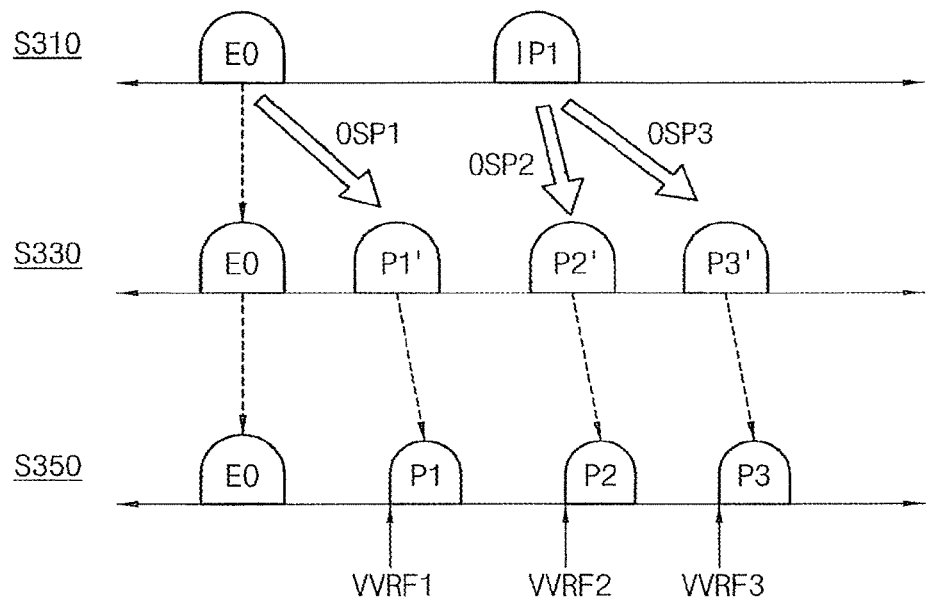
FIG. 10 is a diagram illustrating an example of threshold voltage distributions of multi-levels cells programmed by a program method of FIG. 9.

FIG. 9 is a flow chart illustrating a method of programming a nonvolatile memory device according to example embodiments, and FIG. 10 is a diagram illustrating an example of threshold voltage distributions of multi-levels cells programmed by a program method of FIG. 9.

Referring to FIGS. 9 and 10, an LSB program may be performed such that each multi-level cell may have an erase state E0 or an intermediate state IP1 according to an LSB of corresponding multi-bit data (S310).

After the LSB program, an MSB program may be performed to program MSBs of the multi-bit data in the multi-level cells (S320). The MSB program may include an MSB pre-program and an MSB main program.

The MSB pre-program may be performed by applying a plurality of one-shot pulses OSP1, OSP2 and OSP3 to the multi-level cells that are to be programmed to target program states P1, P2 and P3 (S330). For example, the multi-level cells to be programmed to a first target program state P1 may be programmed to an intermediate program state P1' corresponding to the first target program state P1 by applying a first one-shot pulse OSP1, the multi-level cells to be programmed to a second target program state P2 may be programmed to an intermediate program state P2' corresponding to the second target program state P2 by applying a second one-shot pulse OSP2, and the multi-level cells to be programmed to a third target program state P3 may be programmed to an intermediate program state P3' corresponding to the third target program state P3 by applying a third one-shot pulse OSP3.

In some embodiments, the first through third one-shot pulses OSP1, OSP2 and OSP3 may be sequentially applied. For example, to pre-program the multi-level cells to be programmed to the first target program state P1, a first voltage of low level may be applied to bitlines coupled to the multi-level cells to be programmed to the first target program state P1, a second voltage of high level may be applied to bitlines coupled to the other multi-level cells, and the first one-shot pulse OSP1 may be applied to a selected wordline. After that, to pre-program the multi-level cells to be programmed to the second target program state P2, the first voltage may be applied to bitlines coupled to the multi-level cells to be programmed to the second target program state P2, the second voltage may be applied to bitlines coupled to the other multi-level cells, and the second one-shot pulse OSP2 may be applied to the selected wordline. After that, to pre-program the multi-level cells to be programmed to the third target program state P3, the first voltage may be applied to bitlines coupled to the multi-level cells to be programmed to the third target program state P3, the second voltage may be applied to bitlines coupled to the other multi-level cells, and the third one-shot pulse OSP3 may be applied to the selected wordline.

An MSB main program may be performed such that each multi-level cell has one of the erase state E0, the first target program state P1, the second target program state P2 and the third target program state P3 according to the multi-bit data (S350).

As described above, in a method of programming a nonvolatile memory device according to example embodiments, since the MSB pre-program is performed on the multi-level cells to be programmed to the target program states P1, P2 and P3, widths of the target states E0, P1, P2 and P3 may be reduced.

Figure 11:
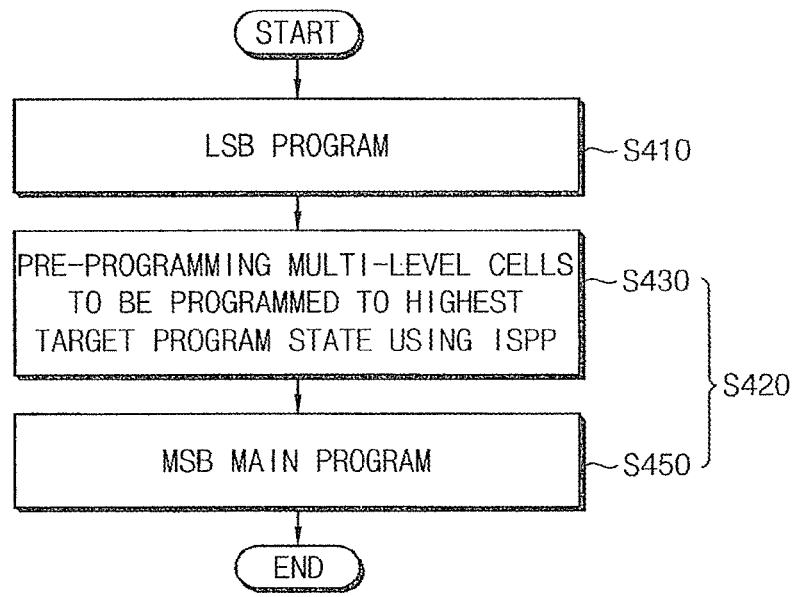
FIG. 11 is a flow chart illustrating a method of programming a nonvolatile memory device according to example embodiments.
Figure 12:
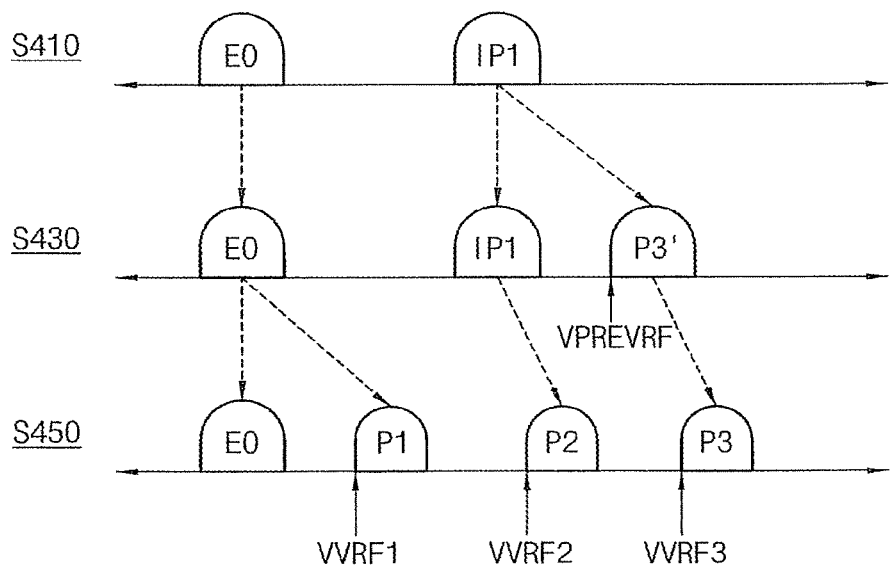
FIG. 12 is a diagram illustrating an example of threshold voltage distributions of multi-levels cells programmed by a program method of FIG. 11.

FIG. 11 is a flow chart illustrating a method of programming a nonvolatile memory device according to example embodiments, and FIG. 12 is a diagram illustrating an example of threshold voltage distributions of multi-levels cells programmed by a program method of FIG. 11.

Referring to FIGS. 11 and 12, an LSB program may be performed such that each multi-level cell may have an erase state E0 or an intermediate state IP1 according to an LSB of corresponding multi-bit data (S410).

After the LSB program, an MSB program may be performed to program MSBs of the multi-bit data in the multi-level cells (S420). The MSB program may include an MSB pre-program and an MSB main program.

The MSB pre-program may be performed on the multi-level cells that are to be programmed to the highest target program state P3 using an ISPP method (S430). For example, to pre-program the multi-level cells to an intermediate program state P3' corresponding to the highest target program state P3, a first voltage of low level may be applied to bitlines coupled to the multi-level cells to be programmed to the highest target program state P3, a second voltage of high level may be applied to bitlines coupled to the other multi-level cells, and an incremental step pulse may be applied to a selected wordline. By applying a pre-program verify voltage VPREVRF to the selected wordline, it may be verified whether the multi-level cells are properly programmed to the intermediate program state P3' corresponding to the highest target program state P3. After that, the first voltage may be again applied to bitlines coupled to the multi-level cells having threshold voltages lower than the pre-program verify voltage VPREVRF, the second voltage may be again applied to bitlines coupled to the other multi-level cells, and the incremental step pulse that is increased by a step voltage may be again applied to the selected wordline. The pre-program verify voltage VPREVRF may be again applied to the selected wordline. In this way, applying the incremental step pulse and applying the pre-program verify voltage VPREVRF may be repeated until the threshold voltages of all the multi-level cells to be programmed to the highest target program state P3 become equal to or higher than the pre-program verify voltage VPREVRF. By the MSB pre-program of the ISPP manner, the multi-level cells to be programmed to the highest target program state P3 may have the intermediate program state P3' corresponding to the highest target program state P3.

The pre-program verify voltage VPREVRF corresponding to the intermediate program state P3' may be lower than a verify voltage VVRF3 corresponding to the highest target program state P3. Further, in some embodiments, a voltage level of an initial step pulse of the MSB pre-program may be lower than that of an initial step pulse of an MSB main program.

The MSB main program may be performed such that each multi-level cell has one of the erase state E0, a first target program state P1, a second target program state P2 and the third target program state P3 according to the multi-bit data (S450).

As described above, in a method of programming a nonvolatile memory device according to example embodiments, since the MSB pre-program is performed on the multi-level cells to be programmed to the highest target program state P3, an undesired threshold voltage shift of a multi-level cell having the erase state E0 due to coupling or a disturb may be reduced, and widths of the target states E0, P1, P2 and P3 may be reduced.

Figure 13:
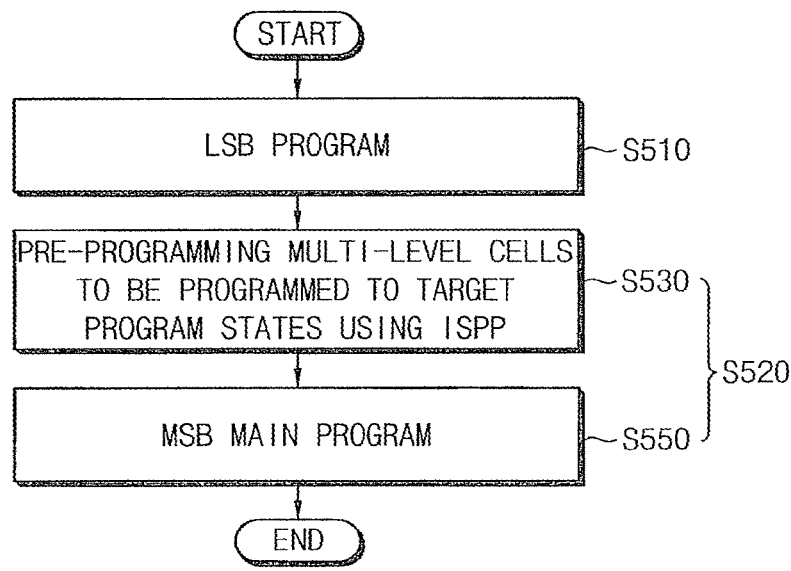
FIG. 13 is a flow chart illustrating a method of programming a nonvolatile memory device according to example embodiments.
Figure 14:
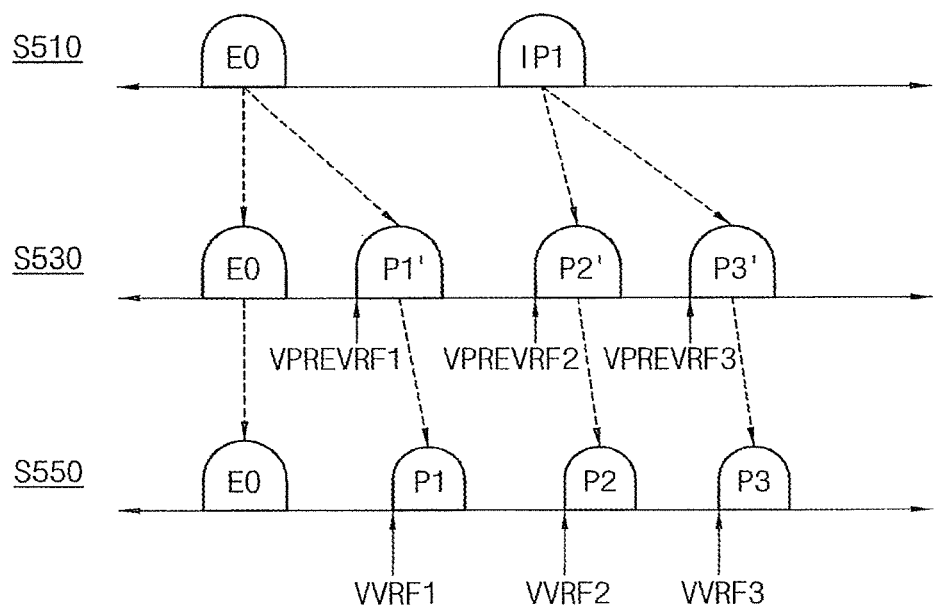
FIG. 14 is a diagram illustrating an example of threshold voltage distributions of multi-levels cells programmed by a program method of FIG. 13.

FIG. 13 is a flow chart illustrating a method of programming a nonvolatile memory device according to example embodiments, and FIG. 14 is a diagram illustrating an example of threshold voltage distributions of multi-level cells programmed by a program method of FIG. 13.

Referring to FIGS. 13 and 14, an LSB program may be performed such that each multi-level cell may have an erase state E0 or an intermediate state IP1 according to an LSB of corresponding multi-bit data (S510).

After the LSB program, an MSB program may be performed to program MSBs of the multi-bit data in the multi-level cells (S520). The MSB program may include an MSB pre-program and an MSB main program.

The MSB pre-program may be performed on the multi-level cells that are to be programmed to target program states P1, P2 and P3 using an ISPP method (S530). For example, by the MSB pre-program of the ISPP manner, the multi-level cells to be programmed to a first target program state P1 may be programmed to an intermediate program state P1' corresponding to the first target program state P1, the multi-level cells to be programmed to a second target program state P2 may be programmed to an intermediate program state P2' corresponding to the second target program state P2, and the multi-level cells to be programmed to a third target program state P3 may be programmed to an intermediate program state P3' corresponding to the third target program state P3.

In some embodiments, pre-programming the memory cells to be programmed to the first through third target program states P1, P2 and P3 may be simultaneously performed. For example, by applying a single incremental step pulse, pre-programming the memory cells to be programmed to the first through third target program states P1, P2 and P3 may be performed. Further, the MSB pre-program of the ISPP manner may include a verify step using first through third pre-program verify voltages VPREVRF1, VPREVRF2 and VPREVRF3. Thus, by the MSB pre-program, threshold voltages of the multi-level cells to be programmed to the first target program state P1 may become equal to or higher than the first pre-program verify voltage VPREVRF1, threshold voltages of the multi-level cells to be programmed to the second target program state P2 may become equal to or higher than the second pre-program verify voltage VPREVRF2, and threshold voltages of the multi-level cells to be programmed to the third target program state P3 may become equal to or higher than the third pre-program verify voltage VPREVRF3.

In some embodiments, the first through third pre-program verify voltages VPREVRF1, VPREVRF2 and VPREVRF3 corresponding to the intermediate program states P1', P2' and P3' may be lower than first through third verify voltages VVRF1, VVRF2 and VVRF3 corresponding to the first through third target program states P1, P2 and P3, respectively. Further, in some embodiments, a voltage level of an initial step pulse of the MSB pre-program may be lower than that of an initial step pulse of an MSB main program.

The MSB main program may be performed such that each multi-level cell has one of the erase state E0, the first target program state P1, the second target program state P2 and the third target program state P3 according to the multi-bit data (S550).

As described above, in a method of programming a nonvolatile memory device according to example embodiments, since the MSB pre-program is performed on the multi-level cells to be programmed to the target program states P1, P2 and P3, widths of the target states E0, P1, P2 and P3 may be reduced.

Figure 15:
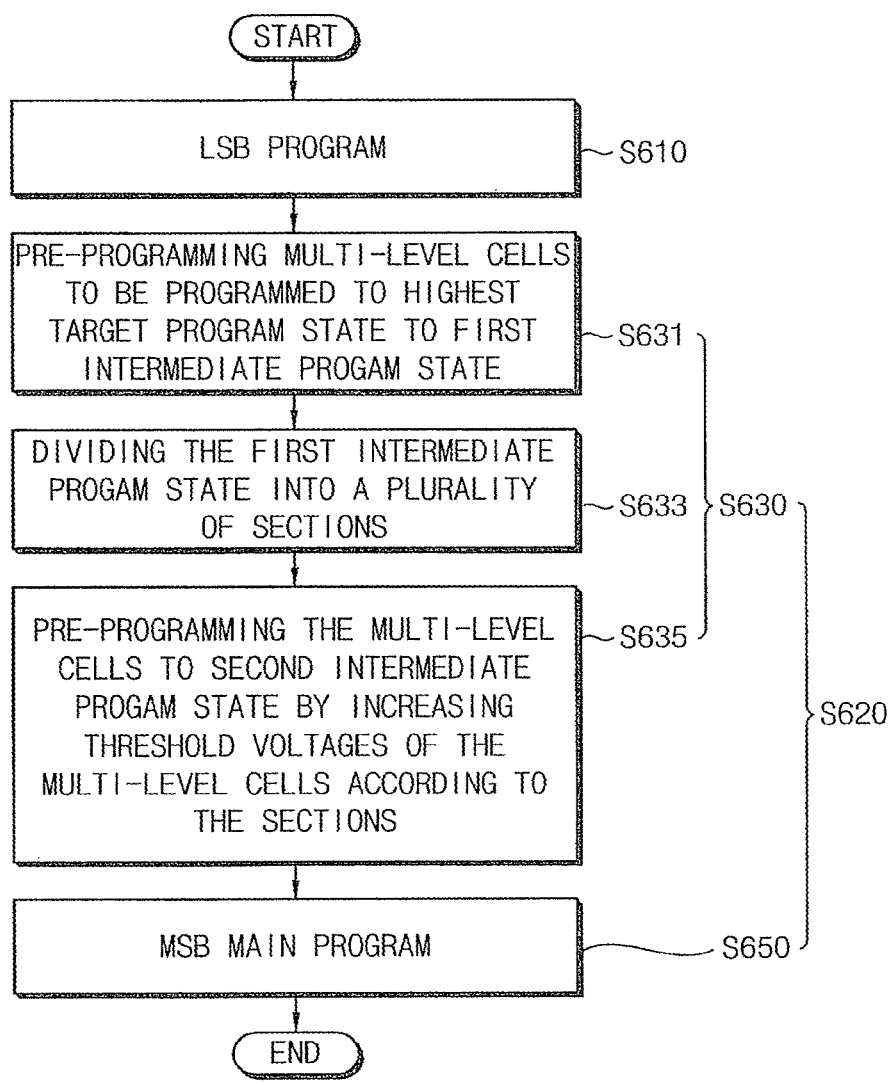
FIG. 15 is a flow chart illustrating a method of programming a nonvolatile memory device according to example embodiments.
Figure 16:
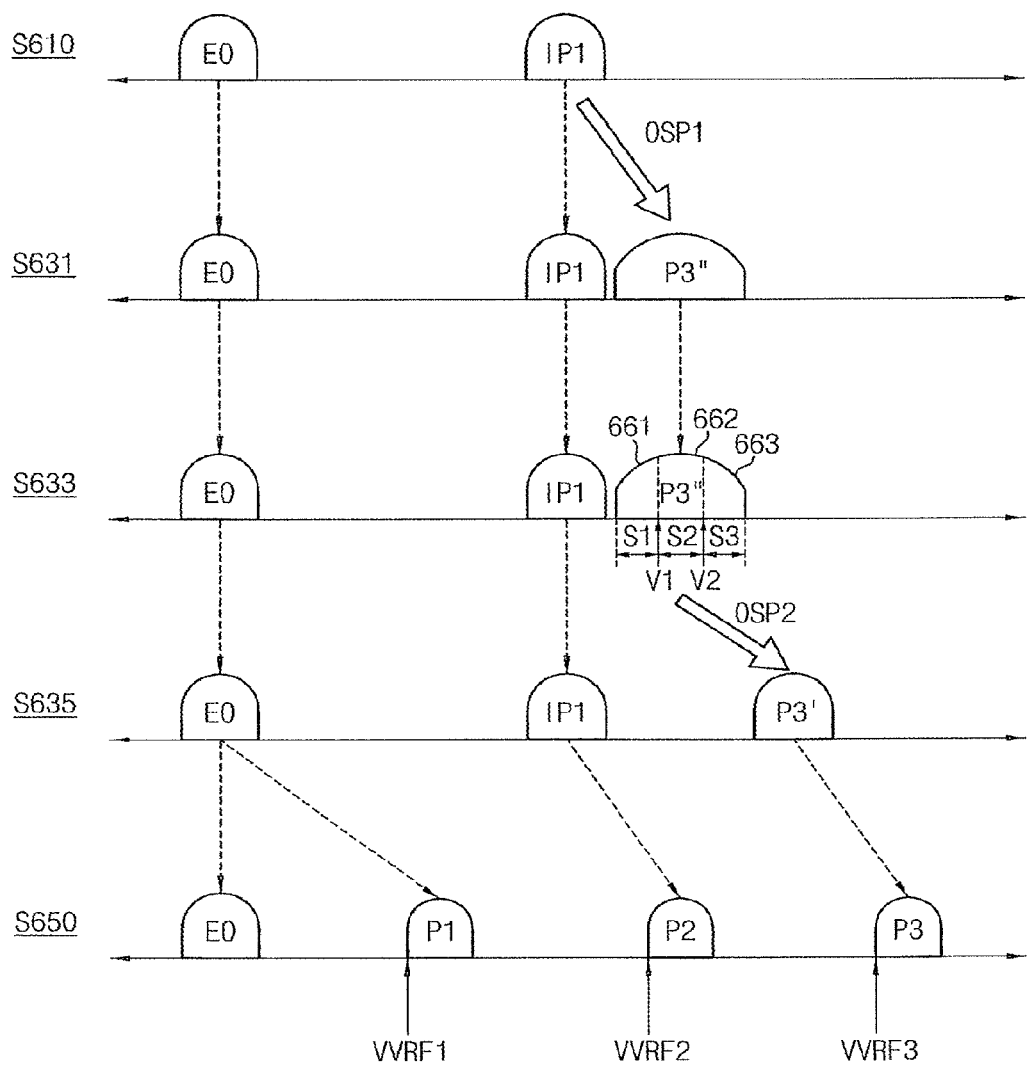
FIG. 16 is a diagram illustrating an example of threshold voltage distributions of multi-levels cells programmed by a program method of FIG. 15.

FIG. 15 is a flow chart illustrating a method of programming a nonvolatile memory device according to example embodiments, and FIG. 16 is a diagram illustrating an example of threshold voltage distributions of multi-levels cells programmed by a program method of FIG. 15.

Referring to FIGS. 15 and 16, an LSB program may be performed such that each multi-level cell may have an erase state E0 or an intermediate state IP1 according to an LSB of corresponding multi-bit data (S610).

After the LSB program, an MSB program may be performed to program MSBs of the multi-bit data in the multi-level cells (S620). The MSB program may include an MSB pre-program and an MSB main program.

The MSB pre-program may include a first pre-program step (S631), a division step (S633), and a second pre-program step (S635). During the first pre-program step, the multi-level cells that are to be programmed to the highest target program state P3 may be pre-programmed to a first intermediate program state P3" corresponding to the highest target program state P3 by applying a first one-shot pulse OSP1 to the multi-level cells to be programmed to the highest target program state P3 (S631). For example, to pre-program the multi-level cells to the first intermediate program state P3" corresponding to the highest target program state P3, a first voltage of low level may be applied to bitlines coupled to the multi-level cells to be programmed to the highest target program state P3, a second voltage of high level may be applied to bitlines coupled to the other multi-level cells, and the first one-shot pulse OSP1 may be applied to a selected wordline.

During the division step, the first intermediate program state P3" may be divided into a plurality of sections S1, S2 and S3 by applying at least one division voltage V1 and V2 to the multi-level cells 661, 662 and 663 programmed to the first intermediate program state P3" (S633). For example, the least one division voltage V1 and V2 may include a first division voltage V1 and a second division voltage V2, and the first intermediate program state P3" may be divided into a first section S1 including threshold voltages lower than the first division voltage V1, a second section S2 including threshold voltages between the first division voltage V1 and the second division voltage V2, and a third section S2 including threshold voltages higher than the second division voltage V2. By sequentially applying the first division voltage V1 and the second division voltage V2 to the selected wordline, it may be determined which of the first through third sections S1, S2 and S3 each multi-level cell 661, 662 and 663 pre-programmed to the first intermediate program state P3" exist in.

During the second pre-program step, the multi-level cells pre-programmed to the first intermediate program state P3" may be further pre-programmed to a second intermediate program state P3' narrower than the first intermediate program state P3" by increasing threshold voltages of the multi-level cells by different voltage levels according to the plurality of sections S1, S2 and S3 (S635). For example, to further pre-program the multi-level cells to the second intermediate program state P3', the first voltage of low level may be applied to bitlines coupled to the multi-level cells 661 in the first section S1, a forcing voltage may be applied to bitlines coupled to the multi-level cells 662 in the second section S2, the second voltage of high level may be applied to bitlines coupled to the multi-level cells 663 in the third section S3 and the other multi-level cells, and a second one-shot pulse OSP2 may be applied to the selected wordline. For example, the first voltage of low level may be a low power supply voltage or a ground voltage, the second voltage of high level may be a high power supply voltage, and the forcing voltage may be higher than the first voltage and lower than the second voltage. In some embodiments, the forcing voltage may have a voltage level corresponding to a voltage level difference between the first voltage V1 for separating the first section S1 and the second section S2 and the second voltage V2 for separating the second section S2 and the third section S3. By the forcing voltage, channel voltages of the multi-level cells 662 in the second section S2 may be increased, and thus an effective voltage level of the second one-shot pulse OSP2 may be decreased for the multi-level cells 662 in the second section S2. Accordingly, increments of the threshold voltages of the multi-level cells 662 in the second section S2 may be smaller than those of the multi-level cells 661 in the first section 51. Further, since the second voltage of high level is applied to the bitlines coupled to the multi-level cells 663 in the third section S3, threshold voltages of the multi-level cells 663 in the third section S3 may not be increased.

As described above, the MSB pre-program may be performed on the multi-level cells 661, 662 and 663 to be programmed to the highest target program state P3 by applying the first one-shot pulse OSP1, by dividing into the plurality of sections S1, S2 and S3, and by applying the second one-shot pulse OSP2 (S630). Since the threshold voltages of the multi-level cells 661, 662 and 663 are increased by different voltage levels according to the plurality of sections S1, S2 and S3, the multi-level cells 661, 662 and 663 may be pre-programmed to the second intermediate program state P3' having a narrow width.

The MSB main program may be performed such that each multi-level cell has one of the erase state E0, a first target program state P1, a second target program state P2 and the third target program state P3 according to the multi-bit data (S650).

As described above, in a method of programming a nonvolatile memory device according to example embodiments, since the MSB pre-program is performed on the multi-level cells to be programmed to the highest target program state P3, an undesired threshold voltage shift of a multi-level cell having the erase state E0 due to coupling or a disturb may be reduced, and widths of the target states E0, P1, P2 and P3 may be reduced.

Figure 17:
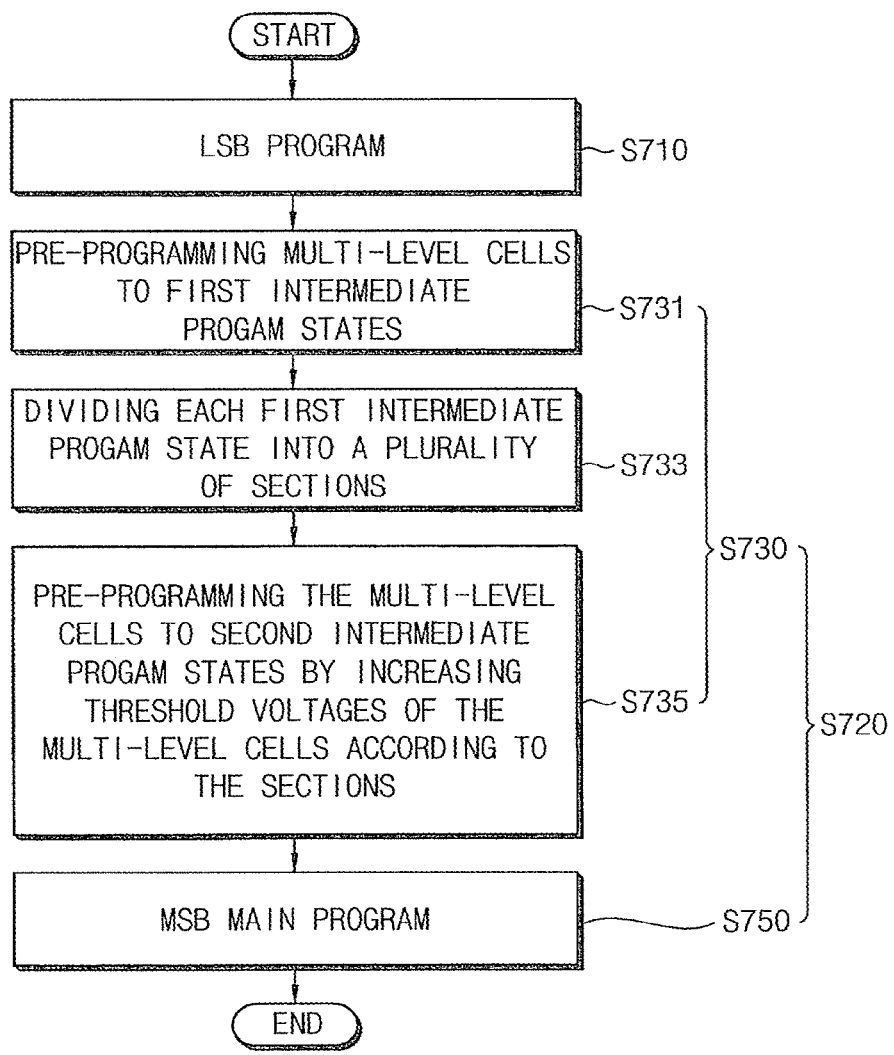
FIG. 17 is a flow chart illustrating a method of programming a nonvolatile memory device according to example embodiments.
Figure 18:
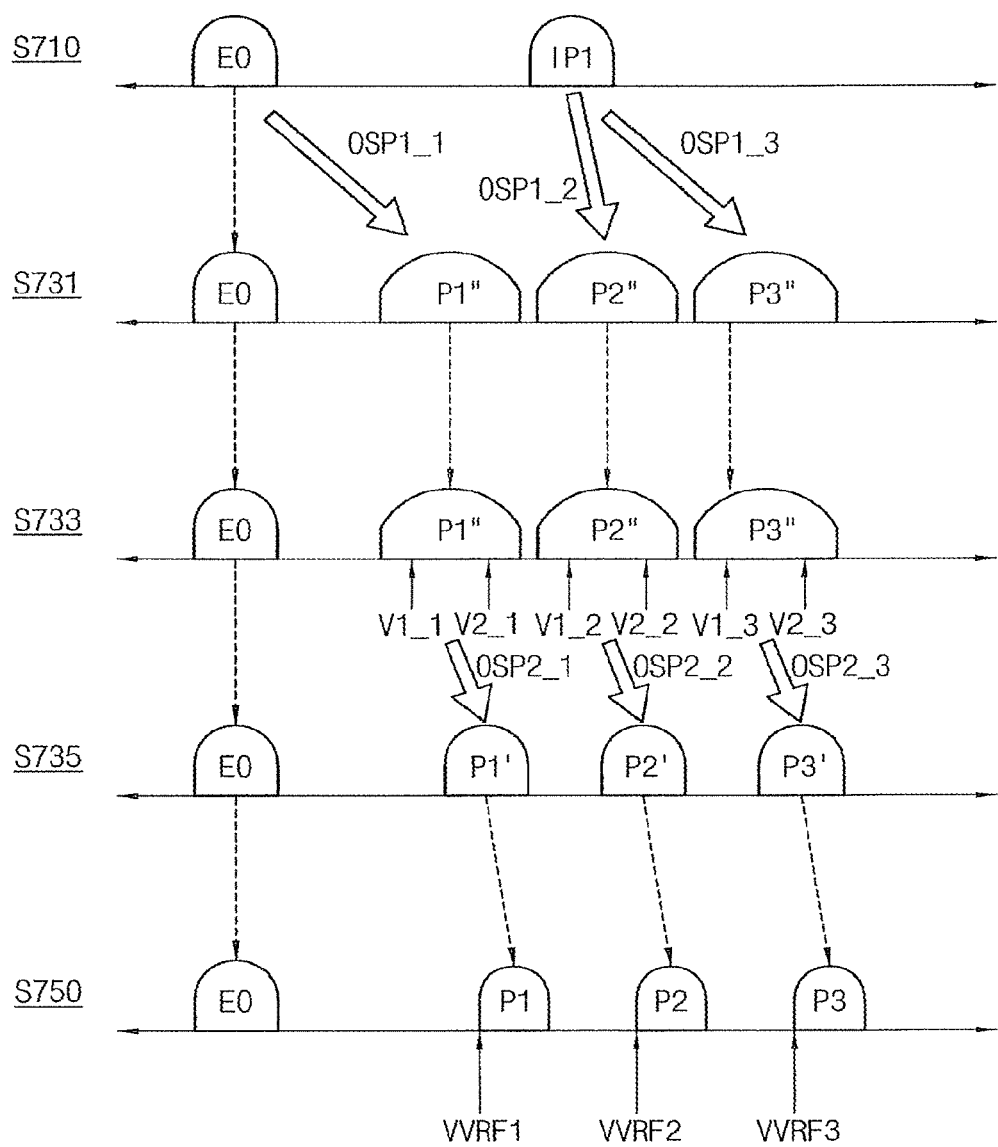
FIG. 18 is a diagram illustrating an example of threshold voltage distributions of multi-levels cells programmed by a program method of FIG. 17.

FIG. 17 is a flow chart illustrating a method of programming a nonvolatile memory device according to example embodiments, and FIG. 18 is a diagram illustrating an example of threshold voltage distributions of multi-levels cells programmed by a program method of FIG. 17.

Referring to FIGS. 17 and 18, an LSB program may be performed such that each multi-level cell may have an erase state E0 or an intermediate state IP1 according to an LSB of corresponding multi-bit data (S710).

After the LSB program, an MSB program may be performed to program MSBs of the multi-bit data in the multi-level cells (S720). The MSB program may include an MSB pre-program and an MSB main program.

The MSB pre-program may include a first pre-program step (S731), a division step (S733), and a second pre-program step (S735). During the first pre-program step, the multi-level cells may be pre-programmed to first intermediate program states P1", P2" and P3" corresponding target program states P1, P2 and P3 by applying a first plurality of one-shot pulses OSP1_1, OSP1_2 and OSP1_3 to the multi-level cells (S731). The first one-shot pulses OSP1_1, OSP1_2 and OSP1_3 may have different voltage levels, and may be sequentially applied to a selected wordline.

During the division step, each first intermediate program state P1", P2" and P3" may be divided into a plurality of sections (S733). For example, one first intermediate program state P1" corresponding to a first target program state P1 may be divided into three sections using first and second division voltages V1_1 and V2_1, another first intermediate program state P2" corresponding to a second target program state P2 may be divided into three sections using third and fourth division voltages V1_2 and V2_2, and the other first intermediate program state P3" corresponding to a third target program state P3 may be divided into three sections using fifth and sixth division voltages V1_3 and V2_3.

During the second pre-program step, the multi-level cells pre-programmed to the first intermediate program states P1", P2" and P3" may be further pre-programmed to second intermediate program states P1', P2' and P3' respectively narrower than the first intermediate program states P1", P2" and P3" by increasing threshold voltages of the multi-level cells by different voltage levels according to the plurality of sections (S735). For example, a first voltage of low level may be applied to bitlines coupled to the multi-level cells in first sections of the first intermediate program states P1", P2" and P3", a forcing voltage may be applied to bitlines coupled to the multi-level cells in second sections of the first intermediate program states P1", P2" and P3", and a second voltage of high level may be applied to bitlines coupled to the multi-level cells in third sections of the first intermediate program states P1", P2" and P3". Further, a second plurality of one-shot pulses OSP2_1, OSP2_2 and OSP2_3 having different voltage levels may be sequentially applied to the selected wordline. Increments of the threshold voltages of the multi-level cells in the second sections of the first intermediate program states P1", P2" and P3" may be smaller than those of the multi-level cells in the first sections S1 of the first intermediate program states P1", P2" and P3", respectively. Further, threshold voltages of the multi-level cells in the third sections S3 of the first intermediate program states P1", P2" and P3" may not be increased.

As described above, the MSB pre-program may be performed on the multi-level cells by applying the first one-shot pulses OSP1_1, OSP1_2 and OSP1_3, by dividing each first intermediate program state P1", P2" and P3" into the plurality of sections, and by applying the second one-shot pulses OSP2_1, OSP_2 and OSP2_3 (S730). With respect to each first intermediate program state P1", P2" and P3", the threshold voltages of the multi-level cells are increased by different voltage levels according to the plurality of sections, and thus the multi-level cells may be pre-programmed to the second intermediate program states P1', P2' and P3' having narrow widths.

The MSB main program may be performed such that each multi-level cell has one of the erase state E0, the first target program state P1, the second target program state P2 and the third target program state P3 according to the multi-bit data (S750).

As described above, in a method of programming a nonvolatile memory device according to example embodiments, since the MSB pre-program is performed on the multi-level cells, widths of the target states E0, P1, P2 and P3 may be reduced.

Although FIGS. 7 through 18 illustrate examples where multi-level cells store two bits of data, the program method according to example embodiments may be also applied to multi-level cells storing three or more bits of data.

Figures 19, 20:
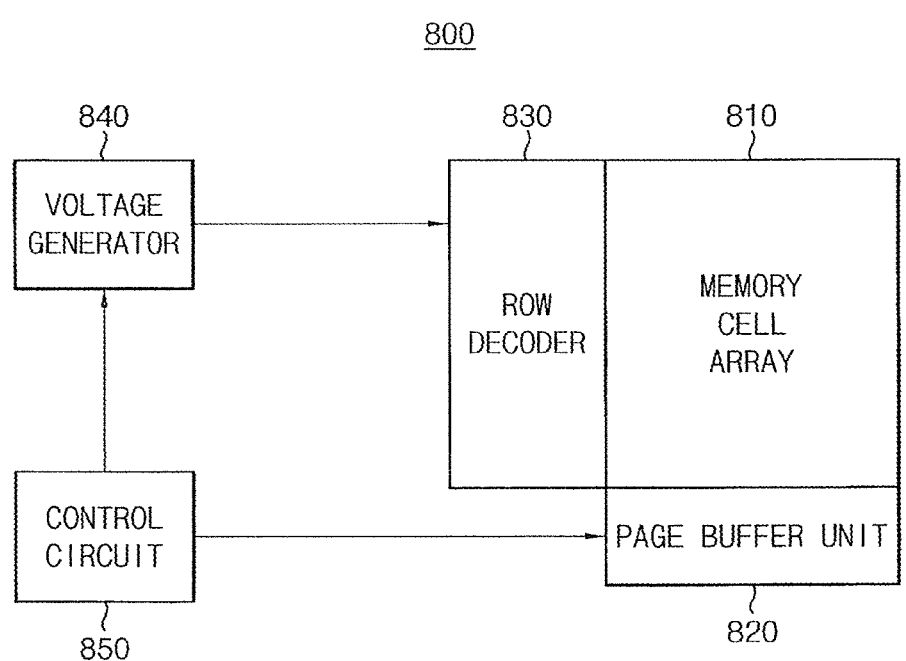
FIG. 19 is a diagram for describing a program order of rows of multi-level cells according to example embodiments.
FIG. 20 is a block diagram illustrating a nonvolatile memory device according to example embodiments.

FIG. 19 is a diagram for describing a program order of rows of multi-level cells according to example embodiments.

Referring to FIG. 19, after an LSB program is performed on multi-level cells coupled to the next wordline (i.e., a wordline that is adjacent to a current wordline), an MSB program may be performed on multi-level cells coupled to the current wordline.

For example, an LSB program for a first wordline WL1 may be performed, and then an LSB program for a second wordline WL2 may be performed. After that, an MSB program for the first wordline WL2 may be performed. Each LSB program and/or each MSB program may include a pre-program and a main program. In some embodiments, the pre-program and the main program may be performed in one sequence. Similarly, after an LSB program for a third wordline WL3 is performed, an MSB program for the second wordline WL2 may be performed.

As described above, since an MSB program for a current wordline may be performed after an LSB program for the next wordline, thereby reducing the wordline coupling.

FIG. 20 is a block diagram illustrating a nonvolatile memory device according to example embodiments.

Referring to FIG. 20, a nonvolatile memory device 800 includes a memory cell array 810, a page buffer unit 820, a row decoder 830, a voltage generator 840 and a control circuit 850.

The memory cell array 810 may include multi-level cells coupled to a plurality of wordlines and a plurality of bitlines. Each multi-level cell may store multi-bit data having at least two bits. The non-volatile memory device 800 may be configured to program the multi-bit data in the multi-level cells using, for example, any of the program methods discussed above with respect to FIGS. 1 through 19.

A program operation for the multi-level cells may include an LSB program and an MSB program. The MSB program may include a pre-program and a main program. The pre-program may be performed on multi-level cells to be programmed to at least one program state. For example, the pre-program may be performed on multi-level cells to be programmed to the highest target program state, or may be performed on multi-level cells to be programmed to all program states. According to example embodiments, the pre-program may be performed by using a one-shot pulse, by using an ISPP, or by increasing threshold voltages according to a plurality of sections. Accordingly, in a program method according to example embodiments, widths of respective target states may be reduced.

The page buffer unit 820 may operate as write drivers or sense amplifiers according to operation modes. For example, the page buffer unit 820 may operate as the sense amplifiers in a read mode, and may operate as the write drivers in a write mode. The page buffer unit 820 may include page buffers that are coupled to the bitlines and temporarily store the multi-bit data. Each page buffer may include be coupled to a corresponding bitline. The page buffers may include data storage latches that temporarily store the multi-bit data.

The row decoder 830 may select a wordline in response to a row address. The row decoder 830 may apply wordline voltages from the voltage generator 840 to selected and non-selected wordlines. During a program operation, the row decoder 830 may apply a program voltage to the selected wordline, and may apply a pass voltage to the non-selected wordlines.

The voltage generator 840 may be controlled by the control circuit 850 to generate the wordline voltages, such as the program voltage, the pass voltage, a pre-program verify voltage, a verify voltage, a read voltage, etc.

The control circuit 850 may control the page buffer unit 820, the row decoder 830 and the voltage generator 840 to program the multi-bit data in the memory cell array 810. The control circuit 850 may control the page buffer unit 820, the row decoder 830 and the voltage generator 840 to perform the LSB program, the MSB pre-program and the MSB main program. For example, during the program operation, the control circuit 850 may control the row decoder 830 and the voltage generator 840 to apply the one-shot pulse, the incremental step pulse, the pre-program verify voltage or the verify voltage to the selected wordline.

The nonvolatile memory device 800 according to example embodiments may perform a pre-program for at least one program state. Accordingly, the multi-level cells of the non-volatile memory device 800 according to example embodiments may be programmed to target program states having narrow widths.

Figure 21:
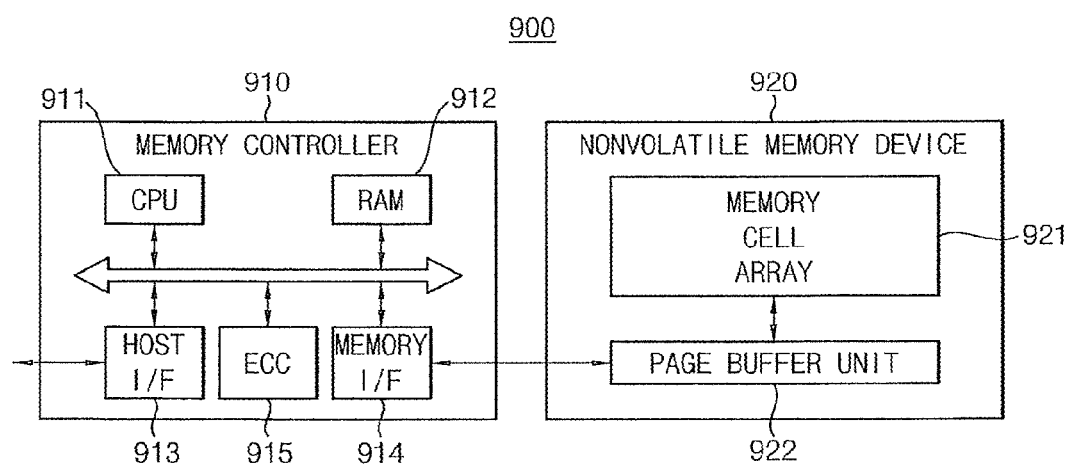
FIG. 21 is a block diagram illustrating a memory system according to example embodiments.

FIG. 21 is a block diagram illustrating a memory system according to example embodiments.

Referring to FIG. 21, a memory system 900 includes a memory controller 910 and a nonvolatile memory device 920.

The nonvolatile memory device 920 includes a memory cell array 921 and a page buffer unit 922. The page buffer unit 922 may include page buffers that are coupled to bitlines and temporarily store multi-bit data. The memory cell array 921 may include multi-level cells coupled to wordlines and the bitlines. The memory controller 910 and a nonvolatile memory device 920 may be configured to program multi-level cells to have narrow threshold voltage distributions by an LSB program, a pre-program and a main program according to, for example, any of the processes discussed above with reference to FIGS. 1-19.

Figure 22:
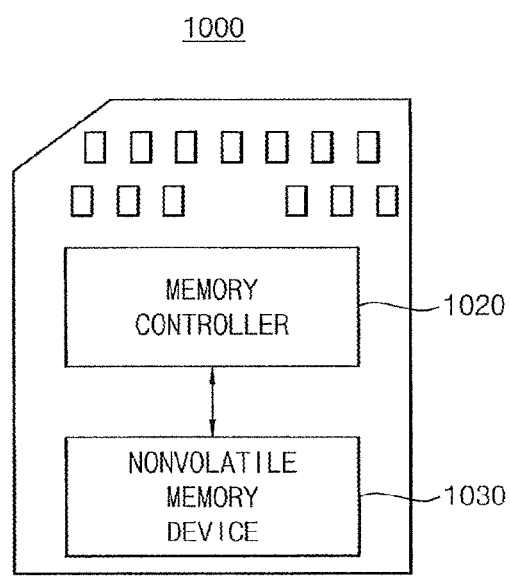
FIG. 22 is a diagram illustrating a memory card including a memory system according to example embodiments.

FIG. 22 is a block diagram illustrating a memory card including memory system according to example embodiments.

Referring to FIG. 22, a memory card 1000 may include a memory controller 1020 and a nonvolatile memory device 1030. The memory controller 1020 may be, for example, the memory controller 910 discussed above with reference to FIG. 20. The nonvolatile memory device 1030 may be, for example, the nonvolatile memory device 920 discussed above with reference to FIG. 20.

In some embodiments, the memory system 1000 may be implemented as a memory card, such as a multimedia card (MMC), an embedded multimedia card (eMMC), a hybrid embedded multimedia card (hybrid eMMC), a secure digital (SD) card, a micro-SD card, a memory stick, an ID card, a personal computer memory card international association (PCMCIA) card, a chip card, a USB card, a smart card, a compact flash (CF) card, etc.

In some embodiments, the memory system 1000 may be coupled to the host, such as a desktop computer, a laptop computer, a mobile phone, a smart phone, a music player, a personal digital assistants (PDA), a portable multimedia player (PMP), a digital television, a digital camera, a portable game console, etc.

Figure 23:
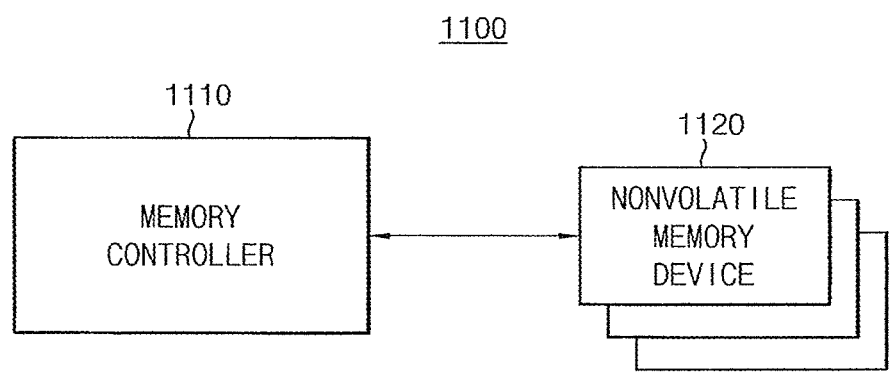
FIG. 23 is a diagram illustrating a solid state drive including a memory system according to example embodiments.

FIG. 23 is a diagram illustrating a solid state drive including a memory system according to example embodiments.

Referring to FIG. 23, a memory system 1100 includes a memory controller 1110 and a plurality of nonvolatile memory devices 1120. In some embodiments, the memory system 1100 may be a solid state drive (SSD).

The memory controller 1110 may receive data from a host (not shown). The memory controller 1110 may store the received data in the plurality of nonvolatile memory devices 1120.

The plurality of nonvolatile memory devices 1120 may include multi-level cells. The multi-level cells may be programmed to have narrow threshold voltage distributions by an LSB program, a pre-program and a main program.

In some embodiments, the memory system 1100 may be coupled to the host, such as a mobile device, a mobile phone, a smart phone, a PDA, a PMP, a digital camera, a portable game console, a music player, a desktop computer, a notebook computer, a speaker, a video, a digital television, etc.

The memory controller 1110 may be, for example, the memory controller 910 discussed above with reference to FIG. 20. Any or all of the nonvolatile memory devices 1120 may be, for example, the nonvolatile memory device 920 discussed above with reference to FIG. 20.

Figure 24:
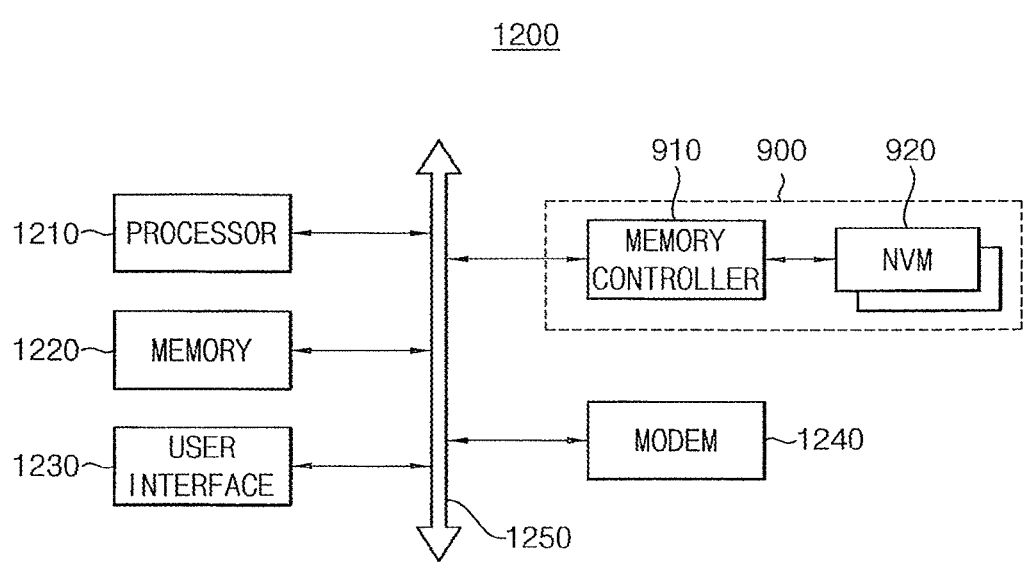
FIG. 24 is a diagram illustrating a computing system according to example embodiments.

FIG. 24 is a diagram illustrating a computing system according to example embodiments.

Referring to FIG. 24, a computing system 1200 includes a processor 1210, a memory 1220, a user interface 1230 and the memory system 900 discussed above with reference to FIG. 20. In some embodiments, the computing system 1200 may further include a modem 1240, such as a baseband chipset.

The processor 1210 may perform various computing functions, such as executing specific software for performing specific calculations or tasks. For example, the processor 1210 may be a microprocessor, a central processing unit (CPU), a digital signal processor, or the like. The processor 1210 may be coupled to the memory 1220 via a bus 1250, such as an address bus, a control bus and/or a data bus. For example, the memory 1220 may be implemented by a DRAM, a mobile DRAM, a SRAM, a PRAM, a FRAM, a RRAM, a MRAM and/or a flash memory. Further, the processor 1210 may be coupled to an extension bus, such as a peripheral component interconnect (PCI) bus, and may control the user interface 1230 including at least one input device, such as a keyboard, a mouse, a touch screen, etc., and at least one output device, a printer, a display device, etc. The modem 1240 may perform wired or wireless communication with an external device. The nonvolatile memory device 920 may be controlled by a memory controller 910 to store data processed by the processor 1210 or data received via the modem 1240. In some embodiments, the computing system 1200 may further include a power supply, an application chipset, a camera image processor (CIS), etc.

The nonvolatile memory devices 920 may include multi-level cells. The multi-level cells may be programmed to have narrow threshold voltage distributions by an LSB program, a pre-program and a main program.

At least some example embodiments may be applied to any nonvolatile memory device including multi-level cells, and devices and systems including the nonvolatile memory device. For example at least some example embodiments may be applied to various electronic devices, such as a memory card, a solid state drive, a desktop computer, a laptop computer, a mobile phone, a smart phone, a music player, a PDA, a PMP, a digital television, a digital camera, a portable game console, etc.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A method of programming a nonvolatile memory device including a plurality of multi-level cells coupled to a wordline, the method comprising:
    performing a least significant bit (LSB) program operation that programs LSBs of 2-bit data in the plurality of multi-level cells; and
    performing a most significant bit (MSB) program operation that programs MSBs of the 2-bit data in the plurality of multi-level cells, the MSB program operation including,
        an MSB pre-program operation that pre-programs first multi-level cells from among the plurality of multi-level cells to an intermediate program state, the first multi-level cells being ones of the plurality of multi-level cells that are to be programmed to a highest target program state among a plurality of target program states, and
        an MSB main program operation, separate from the MSB pre-program operation, that programs the plurality of multi-level cells to the plurality of target program states corresponding to the 2-bit data by applying at least one program pulse to the plurality of multi-level cells, the MSB main program operation including a verify operation to verify that the plurality of multi-level cells are programmed to the plurality of target program states, and
    the MSB pre-program operation comprising,
        applying a program voltage to first bitlines coupled to the first multi-level cells,
        applying an inhibit voltage to second bitlines coupled to second multi-level cells other than the first multi-level cells from among the plurality of multi-level cells, the second multi-level cells including ones of the plurality of multi-level cells that are to be programmed to one of the plurality of target program states adjacent to the highest target program state, and the inhibit voltage being higher than the program voltage, and
        applying a one-shot pulse to the wordline to pre-program the first multi-level cells to the intermediate program state corresponding to the highest target program state,
    wherein a verify operation for the intermediate program state is not performed.

2. The method of claim 1, wherein the first multi-level cells are programmed by the MSB main program operation from the intermediate program state to the highest target program state having a width narrower than a width of the intermediate program state.

3. The method of claim 1, wherein the one-shot pulse has a voltage level sufficient to substantially increase a threshold voltage of at least one of the first multi-level cells.

4. The method of claim 1, wherein the program voltage applied to the first bitlines during the MSB pre-program operation is a ground voltage.

5. The method of claim 1, wherein the program voltage applied to the first bitlines during the MSB pre-program operation is a voltage higher than a ground voltage.

6. A nonvolatile memory device comprising:
    a memory cell array including a plurality of multi-level cells coupled to a wordline;
    a voltage generator configured to generate a first incremental step pulse, a one-shot pulse, and a second incremental step pulse; and
    a control circuit configured
        to perform a least significant bit (LSB) program operation that programs LSBs of 2-bit data in the plurality of multi-level cells by using the first incremental step pulse, and
        to perform a most significant bit (MSB) program operation that programs MSBs of the 2-bit data in the plurality of multi-level cells, the MSB program operation including,
            an MSB pre-program operation that pre-programs first multi-level cells from among the plurality of multi-level cells to an intermediate program state by using the one-shot pulse, the first multi-level cells being ones of the plurality of multi-level cells that are to be programmed to a highest target program state among a plurality of target program states, and
            an MSB main program operation, separate from the MSB pre-program operation, that programs the plurality of multi-level cells to the plurality of target program states corresponding to the 2-bit data by using the second incremental step pulse, the MSB main program operation including a verify operation to verify that the plurality of multi-level cells are programmed to the plurality of target program states, and
        the MSB pre-program operation comprising,
            applying a program voltage to first bitlines coupled to the first multi-level cells,
            applying an inhibit voltage to second bitlines coupled to second multi-level cells other than the first multi-level cells from among the plurality of multi-level cells, the second multi-level cells including ones of the plurality of multi-level cells that are to be programmed to one of the plurality of target program states adjacent to the highest target program state, and the inhibit voltage being higher than the program voltage, and applying the one-shot pulse to the wordline to pre-program the first multi-level cells to the intermediate program state corresponding to the highest target program state, wherein a verify operation for the intermediate program state is not performed.

7. The nonvolatile memory device of claim 6, wherein the first multi-level cells are programmed by the MSB main program operation from the intermediate program state to the highest target program state having a width narrower than a width of the intermediate program state.

8. The nonvolatile memory device of claim 6, wherein the voltage generator generates the one-shot pulse having a voltage level sufficient to substantially increase a threshold voltage of at least one of the first multi-level cells.

9. The nonvolatile memory device of claim 6, wherein the program voltage applied to the first bitlines during the MSB pre-program operation is a ground voltage.

10. The nonvolatile memory device of claim 6, wherein the program voltage applied to the first bitlines during the MSB pre-program operation is a voltage higher than a ground voltage.

* * * * *